(12) United States Patent (10) Patent No.: US 12,364,008 B2
Chen et al. (45) Date of Patent: Jul. 15, 2025

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ming-Hung Chen, Kaohsiung (TW); Yung I Yeh, Kaohsiung (TW); Chang-Lin Yeh, Kaohsiung (TW); Sheng-Yu Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/903,922

(22) Filed: Sep. 6, 2022

(65) Prior Publication Data

US 2023/0005970 A1 Jan. 5, 2023

Related U.S. Application Data

(63) Continuation of application No. 16/557,990, filed on Aug. 30, 2019, now Pat. No. 11,437,415.

(51) Int. Cl.
*H10D 86/60* (2025.01)
*H01L 25/075* (2006.01)
(Continued)

(52) U.S. Cl.
CPC ..... *H10D 86/0214* (2025.01); *H01L 25/0753* (2013.01); *H10D 86/441* (2025.01);
(Continued)

(58) Field of Classification Search
CPC . H01L 29/4908; H01L 29/66742–6678; H01L 29/786–78696; H01L 27/12–13;
(Continued)

(56) References Cited

U.S. PATENT DOCUMENTS 8,791,474 B1 7/2014 Bibl et al.
2017/0005156 A1* 1/2017 Kim ................. G09G 3/3233
(Continued)

OTHER PUBLICATIONS

Final Office Action for U.S. Appl. No. 16/557,990, issued Feb. 1, 2022, 11 pages.
(Continued)

*Primary Examiner* — Moin M Rahman
(74) *Attorney, Agent, or Firm* — FOLEY & LARDNER LLP

(57) ABSTRACT

A semiconductor device package includes a main substrate, at least one thin film transistor (TFT) module, at least one first electronic component, at least one encapsulant and a plurality of light emitting devices. The main substrate has a first surface and a second surface opposite to the first surface. The thin film transistor (TFT) module is disposed adjacent to and electrically connected to the first surface of the main substrate. The first electronic component is disposed adjacent to and electrically connected to the first surface of the main substrate. The encapsulant covers the at least one thin film transistor (TFT) module and the at least one first electronic component. The light emitting devices are electrically connected to the at least one thin film transistor (TFT) module.

9 Claims, 34 Drawing Sheets

(51) Int. Cl.
- *H10D 86/01* (2025.01)
- *H10D 86/40* (2025.01)
- *H10H 20/853* (2025.01)
- *H10H 20/857* (2025.01)
- *H10H 20/01* (2025.01)

(52) U.S. Cl.
CPC .......... *H10D 86/60* (2025.01); *H10H 20/853* (2025.01); *H10H 20/857* (2025.01); *H10H 20/0362* (2025.01); *H10H 20/0364* (2025.01)

(58) Field of Classification Search
CPC ... H01L 2924/13069; H01L 29/04–045; H01L 29/16–1608; H01L 29/18–185; H01L 29/22–2206; H01L 29/36–365; H01L 27/1266; H01L 27/124; H01L 33/62; H01L 25/0753; H01L 33/54; H01L 2933/005; H01L 2933/0066; H01L 2924/10158; H01L 2924/19105; H01L 2924/181; H01L 2224/32225; H01L 2224/73204; H01L 2224/16225; H01L 23/3121; H01L 21/561; H01L 25/16; H01L 25/50; H01L 25/167; H01L 23/481; H01L 23/5226; H01L 23/5283; H01L 24/05; H01L 24/16; H01L 24/81; H01L 21/2855; H01L 2224/0401; H01L 2224/0557; H01L 2224/16147; H01L 2224/81005; H01L 2224/81801; H01L 2924/12041; H01L 2924/1461; H01L 2924/19041; H01L 2924/19102; H01L 24/13; H01L 24/32; H01L 24/73; H01L 24/92; H01L 2224/131; H01L 2224/16227; H01L 2224/16235; H01L 2224/92125; H01L 21/50; H01L 23/49816; H01L 23/49827; H01L 25/00; H10K 59/124; H10K 59/125; H10K 59/126; H10K 59/127; H10K 50/11; H10K 50/15; H10K 50/16; H10K 50/171; H10K 2101/30; H10K 2101/40; H10K 2102/351; H10K 50/852; H10K 59/35; H10K 59/12; H10K 50/156; H10K 2101/00; B60K 37/02; B60K 2370/1523; B60K 2370/331; B60K 2370/52; B60R 1/00; H10D 86/40–60; H10D 86/021–0251; H10D 86/421–427; H10D 86/0221–0229; H10D 86/0223–0229; H10D 86/431; H10D 86/471; H10D 86/481; H10D 86/0214; H10D 86/411; H10D 86/441; B32B 2457/202; H05K 2201/10136; H10H 20/854; H10H 20/857; H10H 20/0362; H10H 20/0364; H10H 29/10

See application file for complete search history.

(56) References Cited

U.S. PATENT DOCUMENTS

| | | | |
|---|---|---|---|
| 2017/0269749 A1* | 9/2017 | Bok | G06F 3/0445 |
| 2017/0278909 A1 | 9/2017 | Jeon et al. | |
| 2020/0266180 A1* | 8/2020 | Pendse | H01L 24/16 |

OTHER PUBLICATIONS

Non-Final Office Action for U.S. Appl. No. 16/557,990, issued Aug. 2, 2021, 11 pages.

Notice of Allowance for U.S. Appl. No. 16/557,990, issued May 2, 2022, 11 pages.

* cited by examiner

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 16/557,990 filed Aug. 30, 2019, now issued as U.S. Pat. No. 11,437,415, the contents of which is incorporated herein by reference in its entirety.

BACKGROUND

1. Technical Field

The present disclosure generally relates to a semiconductor device package and a method of manufacturing the same, and to a semiconductor device package including a light emitting device, and a method of manufacturing the same.

2. Description of the Related Art

A wearable electronic component (e.g., an electronic watch, band or the like) generally has a band attached to a housing which accommodates some electronic components. Extra function(s) may be specified for integration into the watch (geographic information collection or determination; biological information collection or determination, etc.), which means more components (such as Global Positioning System (GPS) module, heart rate sensing module, etc.) should be introduced into the housing. As a result, size and weight of the housing may inevitably increase, which may adversely affect user's experience.

SUMMARY

In accordance with an aspect of the present disclosure, a semiconductor device package includes a main substrate, at least one thin film transistor (TFT) module, at least one first electronic component, at least one encapsulant and a plurality of light emitting devices. The main substrate has a first surface and a second surface opposite to the first surface. The thin film transistor (TFT) module is disposed adjacent to and electrically connected to the first surface of the main substrate. The first electronic component is disposed adjacent to and electrically connected to the first surface of the main substrate. The encapsulant covers the at least one thin film transistor (TFT) module and the at least one first electronic component. The light emitting devices are electrically connected to the at least one thin film transistor (TFT) module.

In accordance another aspect of the present disclosure, a method of manufacturing a semiconductor device package includes (a) providing a carrier; (b) forming at least a portion of a main substrate on the carrier; (c) forming at least one TFT module on the main substrate; (d) electrically connecting at least one first electronic component to the main substrate; (e) forming a plurality of conductive vias and an encapsulant, wherein the encapsulant covers the at least one TFT module and the at least one electronic component, and the conductive vias are electrically connected to the at least one TFT module; (f) electrically connecting a plurality of light emitting devices to the conductive vias; and (g) removing the carrier.

In accordance another aspect of the present disclosure, a method of manufacturing a semiconductor device package includes (a) providing a carrier; (b) forming at least a portion of a main substrate on the carrier; (c) forming a TFT module on the main substrate; (d) forming a first encapsulant to cover the TFT module; (e) electrically connecting at least one first electronic component to the main substrate; and (f) removing the carrier.

Figure 1:
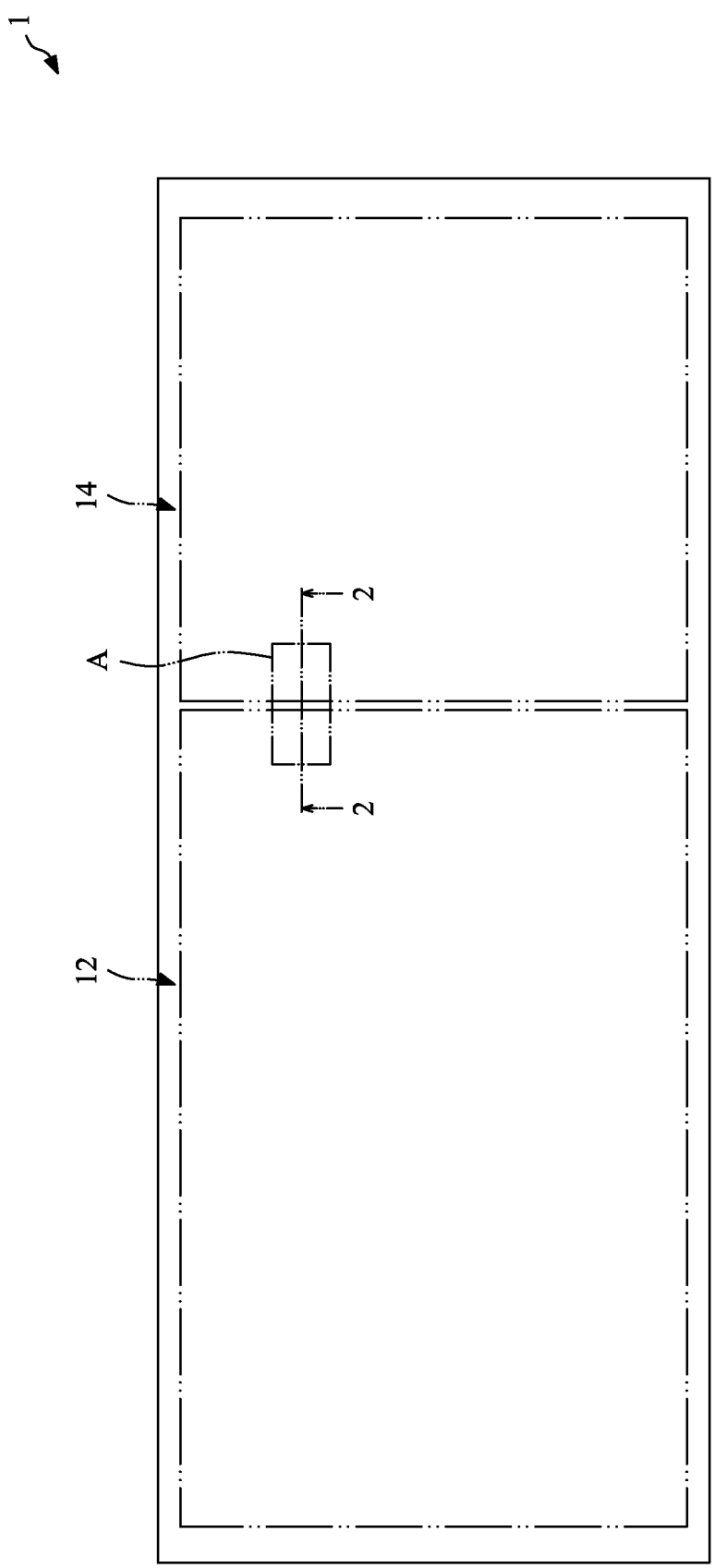
FIG. 1 illustrates a top view of a semiconductor device package in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 2:
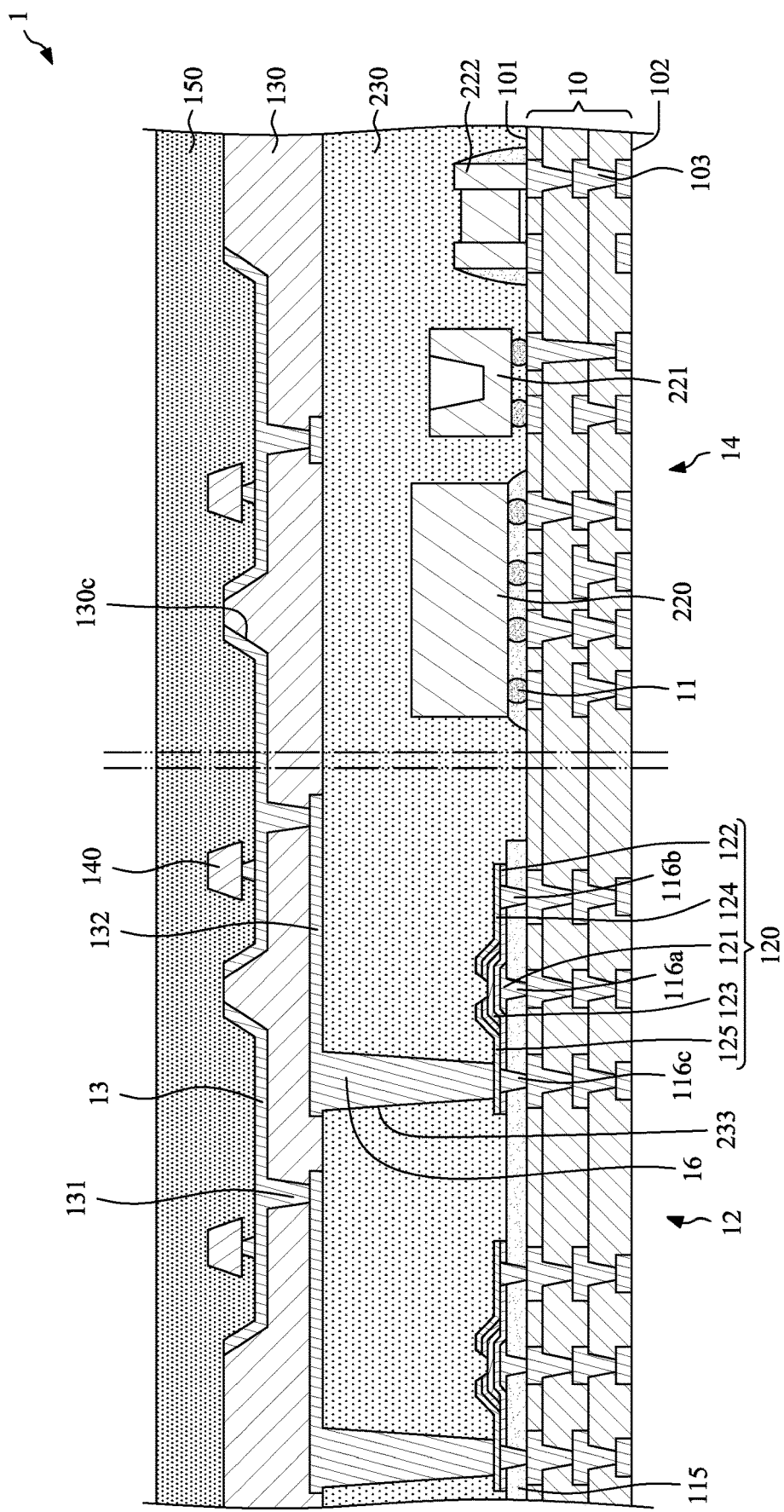
FIG. 2 illustrates an enlarged cross-sectional view taken along line 2-2 in a region "A" in FIG. 1.

FIG. 1 illustrates a top view of a semiconductor device package 1 in accordance with some embodiments of the present disclosure. FIG. 2 illustrates an enlarged cross-sectional view taken along line 2-2 in a region "A" in FIG. 1. The semiconductor device package 1 includes a main substrate 10, at least one thin film transistor (TFT) module 12, a component mounting region 14 (including, for example, at least one first electronic component (such as a plurality of first electronic components 220, 221, 222)), a display device (including, for example, an upper substrate 130, a plurality of light emitting devices 140 and a protection layer 150), at least one encapsulant 230 and at least one conductive via (including, for example, a plurality of conductive vias 16). In some embodiments, the TFT module 12 is disposed on one side of the component mounting region 14. In some embodiments, the semiconductor device package 1 can be used or implemented in a bendable or flexible electronic component (e.g., an electronic watch, an electronic band or the like).

The main substrate 10 may include, for example, a printed circuit board, such as a paper-based copper foil laminate, a composite copper foil laminate, or a polymer-impregnated glass-fiber-based copper foil laminate. The main substrate 10 may include an interconnection structure, such as a redistribution layer (RDL) or a grounding element. For example, the main substrate 10 may include a plurality of interconnection vias 103 that tapers downward. The main substrate 10 has a first surface 101 and a second surface 102 opposite to the first surface 101.

The TFT module 12 is disposed adjacent to and electrically connected to the first surface 101 of the main substrate 10. As shown in FIG. 1, the TFT module 12 is disposed on the first surface 101 of the main substrate 10, and may be formed by optical lithography process. In some embodiments, the TFT module 12 may be or include a driving circuit electrically connected to the light emitting devices 140. For example, the driving circuit is configured to send a driving current (or voltage) to the light emitting devices 140, and the light emitting devices 140 are driven by the driving current to emit light with a luminance that corresponds to a magnitude of the driving current. Various kinds of circuits can serve as the driving circuit for driving the light emitting devices 140. For example, the driving circuit may include a plurality of transistors 120 and at least one storage capacitor. For example, the driving circuit can include a drive configuration indicated as a 5T/1C type, a 4T/1C type, a 3T/1C type, a 2T/1C type or the like, where T represents a transistor and C represents a storage capacitor. In some embodiments, as shown in FIG. 1, the transistor 120 of the driving circuit may include an insulation layer 115, a gate 121, a gate insulator (e.g., dielectric material) 122, a semiconductor channel 123, a drain 124 and a source 125. The insulation layer 115 contacts the first surface 101 of the main substrate 10. In some embodiments, the structure of the transistor 120 of the driving circuit can be changed or adjusted depending on different design specifications. For example, the semiconductor channel 123 may be a two layered structure, and the transistor 120 may include further a passivation layer covering the drain 124, the source 125, the exposed portion of the semiconductor channel 123 and the insulation layer 115.

As shown in FIG. 1, the transistor 120 of the TFT module 12 may be electrically connected to the first surface 101 of the main substrate 10 through a first inner via 116a, a second inner via 116*b* and a third inner via 116*c*. The first inner via 116*a*, the second inner via 116*b* and the third inner via 116*c* extend through the insulation layer 115 and are electrically connected to the gate 121, the drain 124 and the source 125, respectively.

The first electronic components 220, 221, 222 are disposed adjacent to and electrically connected to the first surface 101 of the main substrate 10. As shown in FIG. 1, the first electronic components 220, 221, 222 are disposed in the component mounting region 14 on the first surface 101 of the main substrate 10. Thus, the first electronic components 220, 221, 222 and the TFT module 12 are disposed side by side. That is, a lateral side surface of the first electronic component 220 faces a lateral side surface of the TFT module 12. In some embodiments, the first electronic components 220, 221 and 222 may be or include an active component, a passive component and/or a combination thereof. For example, the first electronic component 220 may be a chip or a die including a semiconductor substrate, one or more integrated circuit devices and one or more overlying interconnection structures therein. For example, the first electronic component 221 may be a sensor or a microelectromechanical systems (MEMS). For example, the first electronic component 222 may be a capacitor. The first electronic components 220, 221, 222 are electrically connected to each other or connected to the transistors 120 of the TFT module 12 through the main substrate 10 (e.g., the interconnection structure). In some embodiments, the electronic components 220, 221 and 222 may be electrically connected to the first surface 101 of the main substrate 10 through, for example, a connecting material 11 such as a solder ball.

The encapsulant 230 is disposed on the first surface 101 of the main substrate 10 and covers the TFT module 12 and the first electronic components 220, 221, 222 concurrently. In some embodiments, the encapsulant 230 may be a molding compound including an epoxy resin with or without fillers dispersed therein. The encapsulant 230 may define a plurality of through holes 233 extending through the encapsulant 230 to expose a portion of the source 125 of the transistor 120.

Each of the conductive vias 16 is disposed in a respective one of the through holes 233. As shown in FIG. 1, the conductive vias 16 is a solid metal structure. Since the through holes 233 may be formed by exposure and development or laser drilling, they may taper downward. Thus, the conductive vias 16 that are formed by filling the through holes 233 with a metal material may also taper downward. In addition, the conductive vias 16 may extend through the encapsulant 230 and contact and electrically connect the source 125 of the transistor 120.

The upper substrate 130 is disposed on the encapsulant 230. The upper substrate 130 may include, for example, a printed circuit board, such as a paper-based copper foil laminate, a composite copper foil laminate, or a polymer-impregnated glass-fiber-based copper foil laminate. The upper substrate 130 may include an interconnection structure (such as a circuit layer 13, an upper via 131 and a RDL 132) or a grounding element. The upper substrate 130 defines a plurality of cavities 130*c* to accommodate the light emitting devices 140. In some embodiments, a depth of the cavity 130*c* can be larger, equal to or less than the thickness of the light emitting device 140 depending on different design specifications. In some embodiments, the cavities 130*c* may be omitted, and the light emitting devices 140 may be disposed on the top surface of the upper substrate 130. In some embodiments, the upper substrate 130 may extend to the entire top surface of the encapsulant 230. That is, some light emitting devices 140 may be disposed in the component mounting region 14, so as to be disposed right above the first electronic components 220, 221, 222.

Each of the light emitting devices 140 is disposed within a respective one of the cavities 130*c* of the upper substrate 130. The light emitting devices 140 are electrically connected to the transistor 120 of the TFT module 12 through the substrate 130 (e.g., through the interconnection structure of the substrate 130) and the conductive vias 16. In some embodiments, each of the light emitting devices 140 may be or include a micro LED. In some embodiments, each of the light emitting devices 140 may be or include a liquid-crystal display (LCD), an organic light emitting diode (OLED) or any other suitable light emitting units.

The protection layer 150 is disposed on the upper substrate 130 and within the cavity 130*c* of the upper substrate 130. The protection layer 150 covers the light emitting devices 140 to protect the light emitting devices 140. In some embodiments, the protection layer 150 is formed of or includes a light transparent material to allow the light emitted by the light emitting devices 140 passing through.

In the embodiment illustrated in FIG. 1, the first electronic components 220, 221, 222 and the TFT module 12 are disposed side by side; thus, a total thickness of the semiconductor device package 1 may be reduced. Further, the upper substrate 130 can protect the first electronic components 220, 221, 222 from being impacted by external force; thus, the thickness of the encapsulant 230 can be reduced, and the total thickness of the semiconductor device package 1 can be reduced accordingly. In addition, the upper substrate 130 may extend to the entire top surface of the encapsulant 230; thus, the area of the display device is increased. For example, if the area of the display device is limited for a design consideration, the pixels of the display device of the semiconductor device package 1 can be increased; thus, the resolution of the display device of the semiconductor device package 1 is relatively high.

Figure 3:
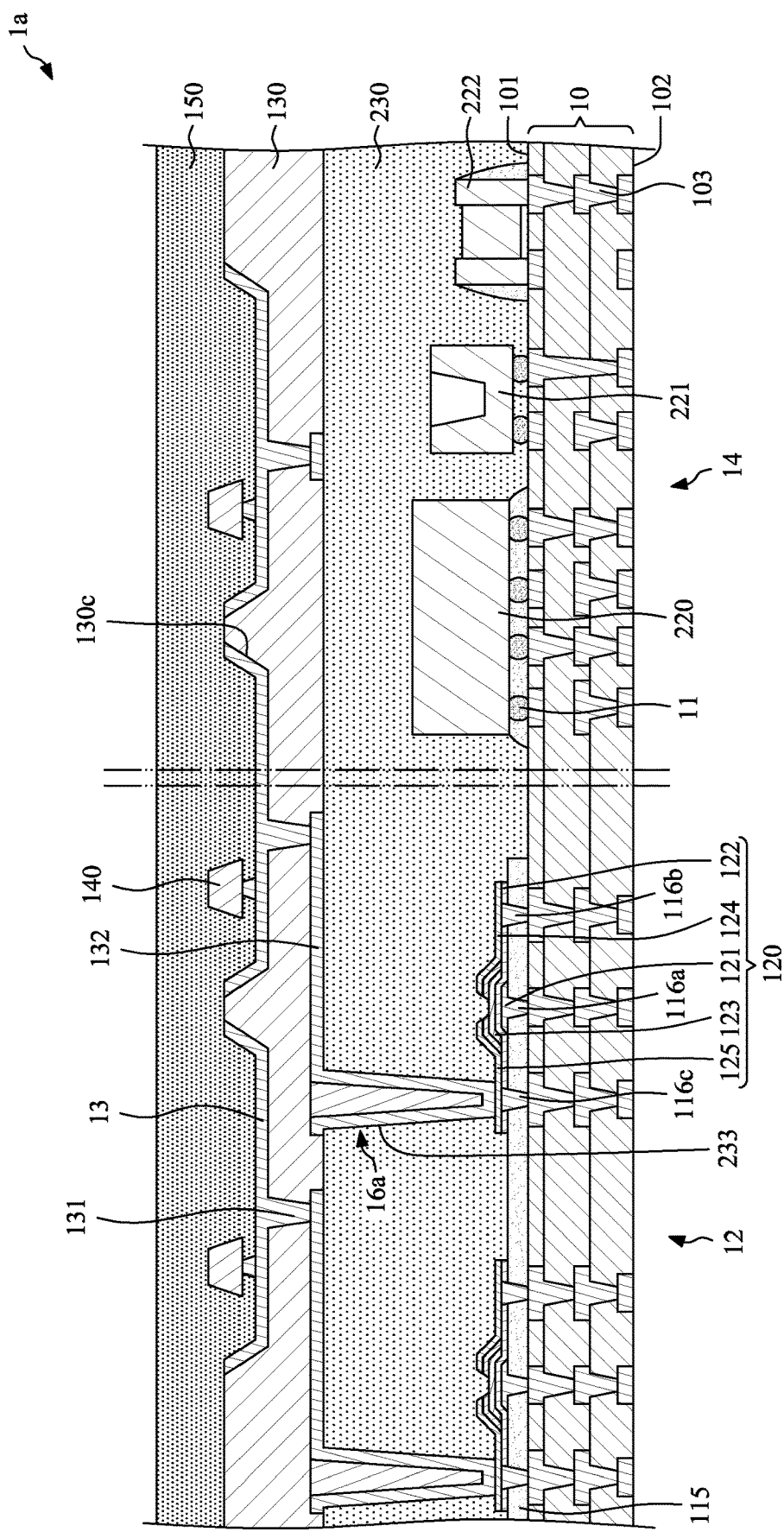
FIG. 3 illustrates an enlarged cross-sectional view of a semiconductor device package in accordance with some embodiments of the present disclosure.

FIG. 3 illustrates an enlarged cross-sectional view of a semiconductor device package 1*a* in accordance with some embodiments of the present disclosure. The semiconductor device package 1*a* is similar to the semiconductor device package 1 in FIG. 1 and FIG. 2 except for structures of the conductive vias 16*a*. As shown in FIG. 3, a metal layer is disposed on the through holes 233 of the encapsulant 230, and defines a central hole. An isolation material fills the central hole defined by the metal layer. A material of the isolation material may be same as or different from a material of the upper substrate 130.

Figure 4:
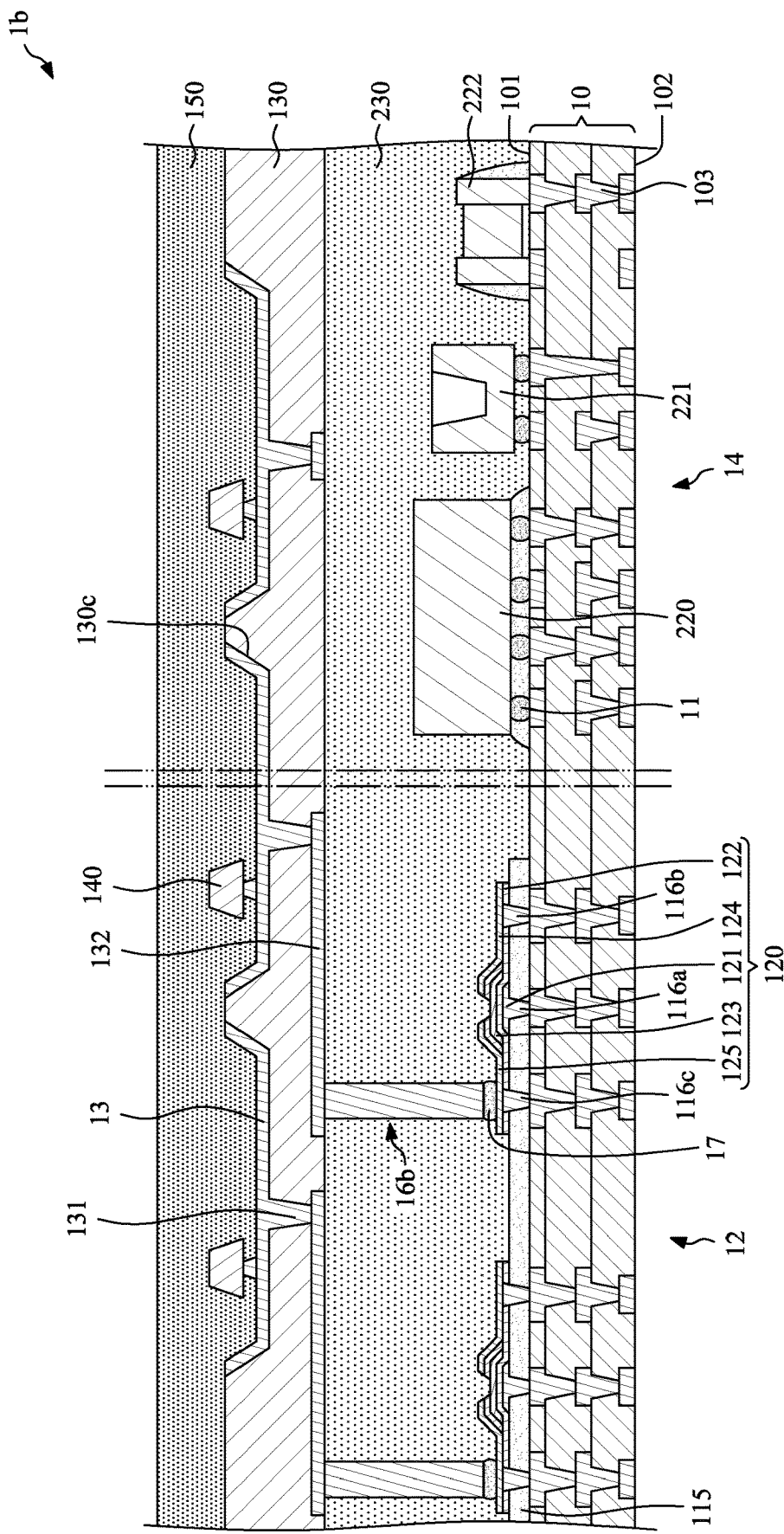
FIG. 4 illustrates an enlarged cross-sectional view of a semiconductor device package in accordance with some embodiments of the present disclosure.

FIG. 4 illustrates an enlarged cross-sectional view of a semiconductor device package 1*b* in accordance with some embodiments of the present disclosure. The semiconductor device package 1*b* is similar to the semiconductor device package 1 in FIG. 1 and FIG. 2 except for structures of the conductive vias 16*b*. As shown in FIG. 4, the conductive vias 16*b* is a solid cylinder, and is electrically connected to the transistor 120 of the TFT module 12 through a connecting material 17.

Figure 5:
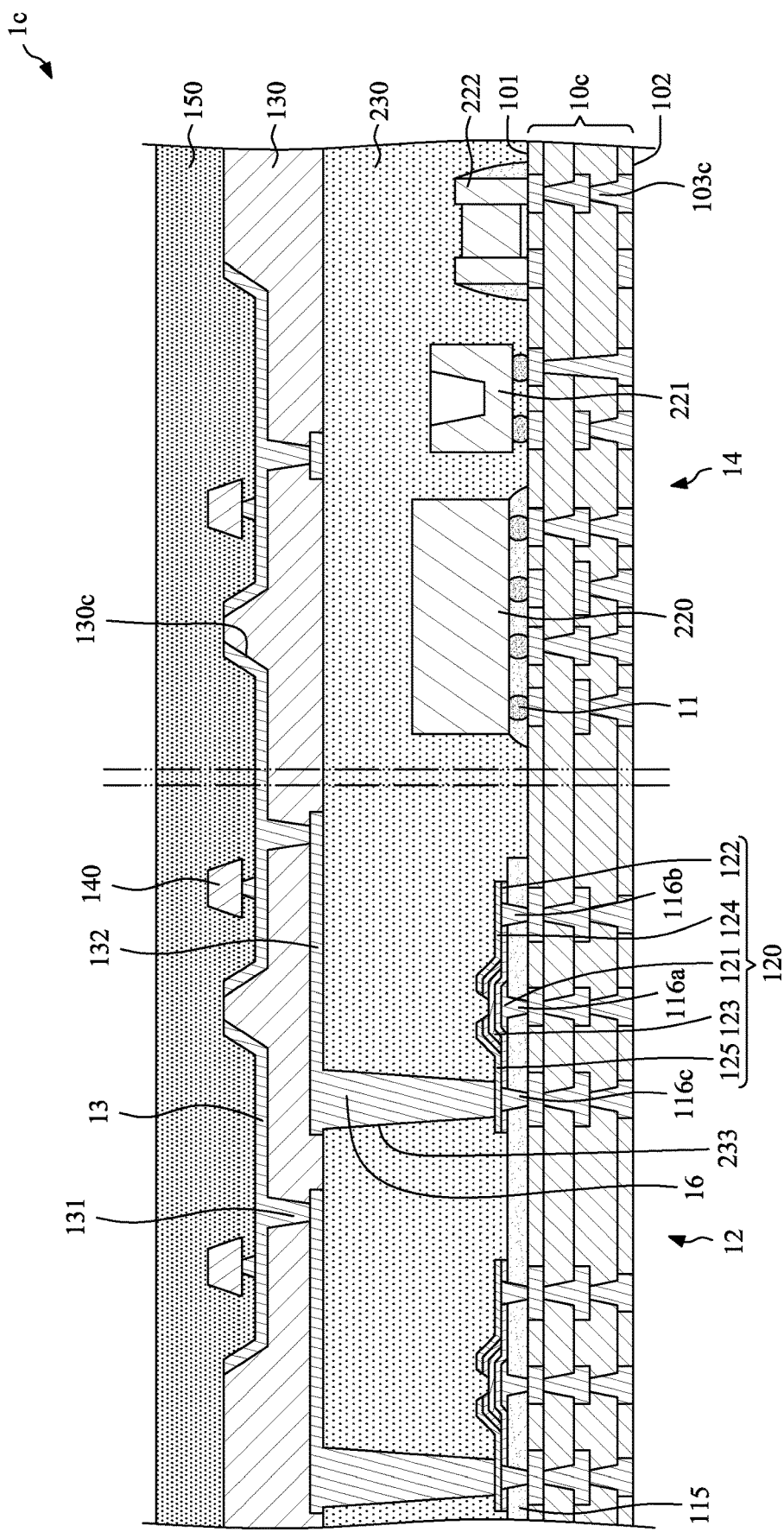
FIG. 5 illustrates an enlarged cross-sectional view of a semiconductor device package in accordance with some embodiments of the present disclosure.

FIG. 5 illustrates an enlarged cross-sectional view of a semiconductor device package 1*c* in accordance with some embodiments of the present disclosure. The semiconductor device package 1*c* is similar to the semiconductor device package 1 in FIG. 1 and FIG. 2 except for a structure of the main substrate 10*c*. As shown in FIG. 5, the main substrate 10*c* includes a plurality of interconnection vias 103*c* that tapers upward.

Figure 6:
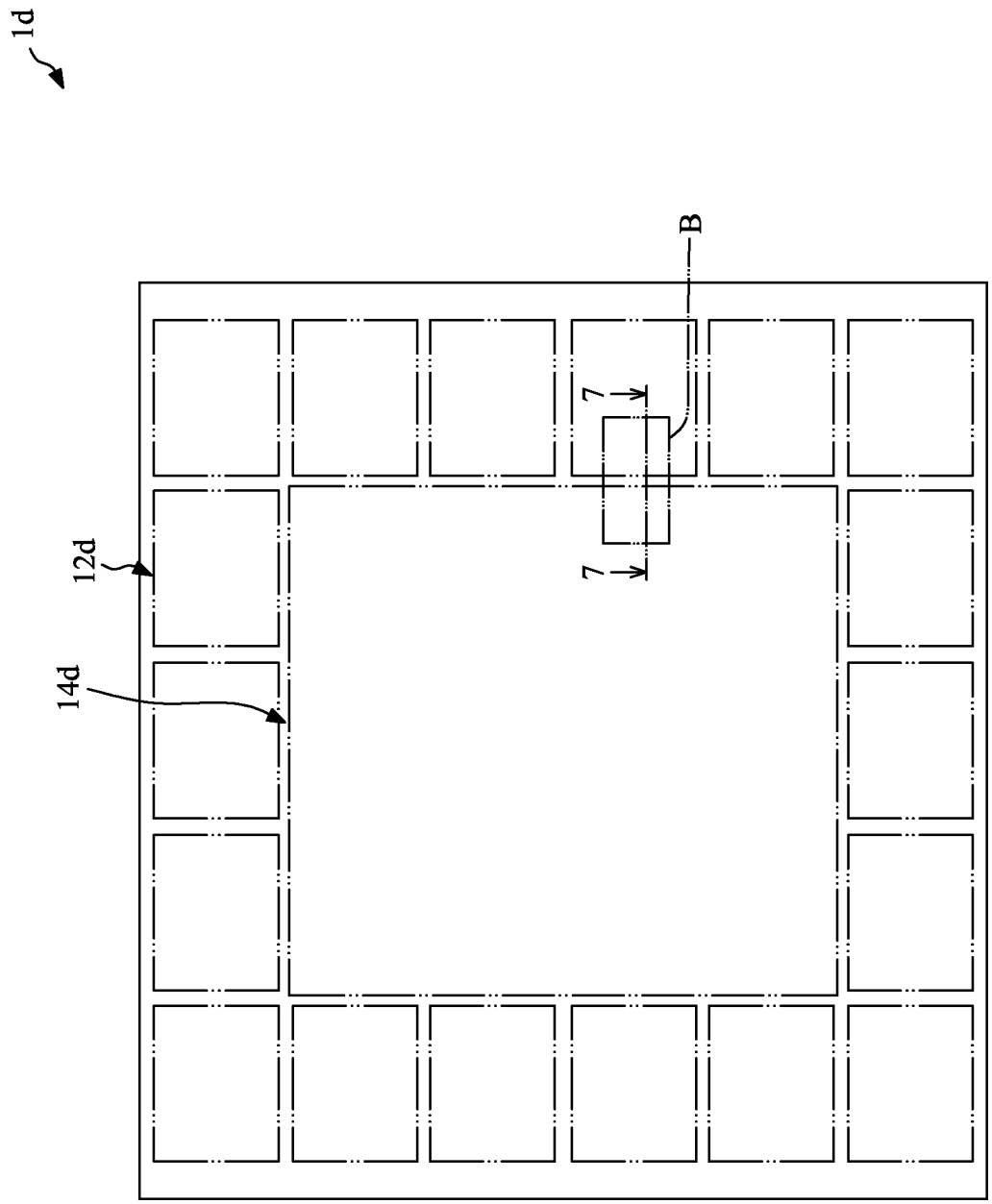
FIG. 6 illustrates a top view of a semiconductor device package in accordance with some embodiments of the present disclosure.
Figure 7:
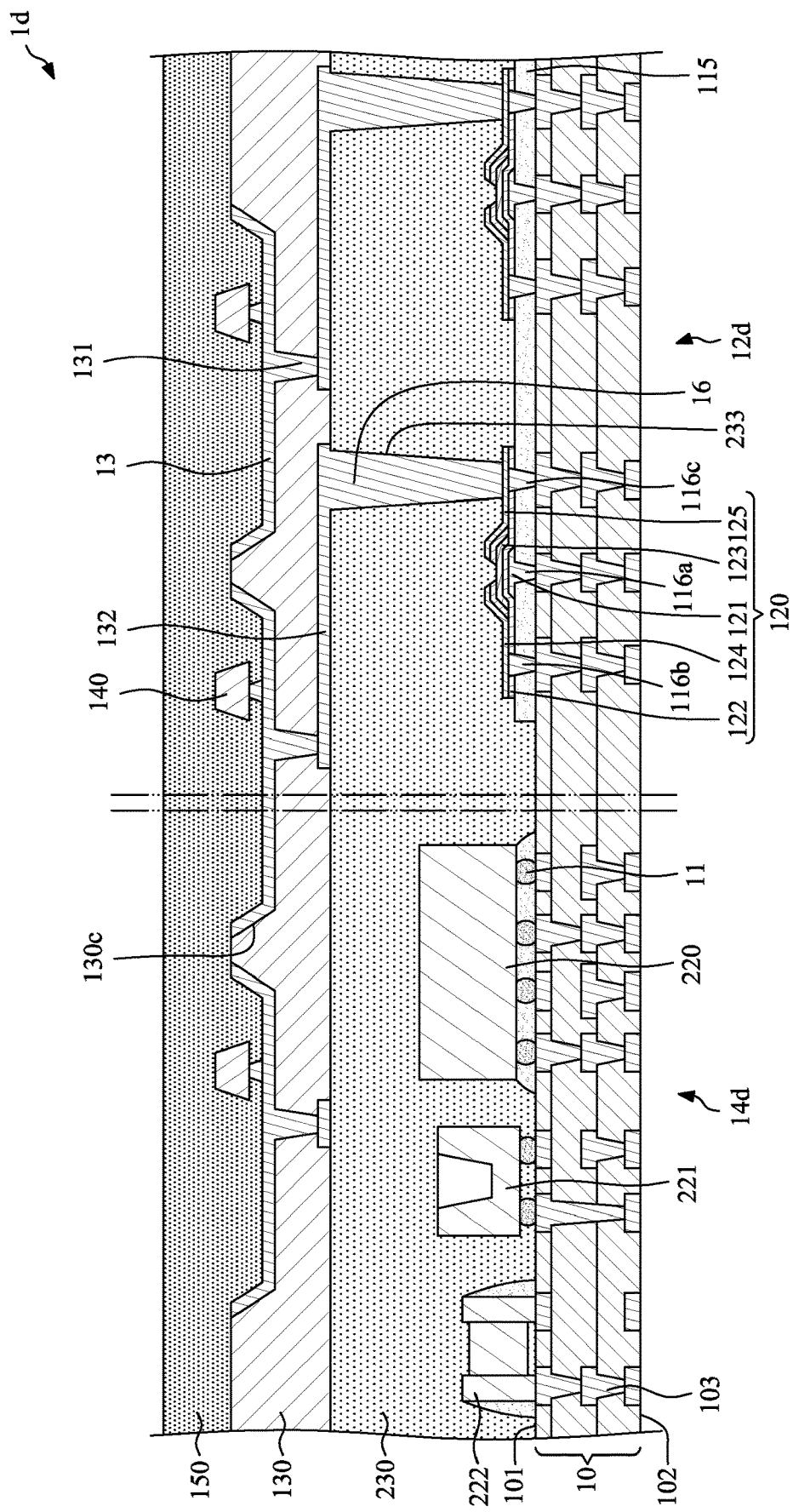
FIG. 7 illustrates an enlarged cross-sectional view taken along line 7-7 in a region "B" in FIG. 6.

FIG. 6 illustrates a top view of a semiconductor device package 1d in accordance with some embodiments of the present disclosure. FIG. 7 illustrates an enlarged cross-sectional view taken along line 7-7 in a region "B" in FIG. 6. The semiconductor device package 1d is similar to the semiconductor device package 1 in FIG. 1 and FIG. 2 except that the semiconductor device package 1d includes a plurality of TFT modules 12d surrounding the component mounting region 14d (including, for example, at least one first electronic component (such as a plurality of first electronic components 220, 221, 222)). As shown in FIG. 6, the electrical path between the drivers (such as the first electronic components 220, 221, 222) and each of the TFT modules 12d is shortened. As a result, the signal delay and the power loss are reduced.

Figure 8:
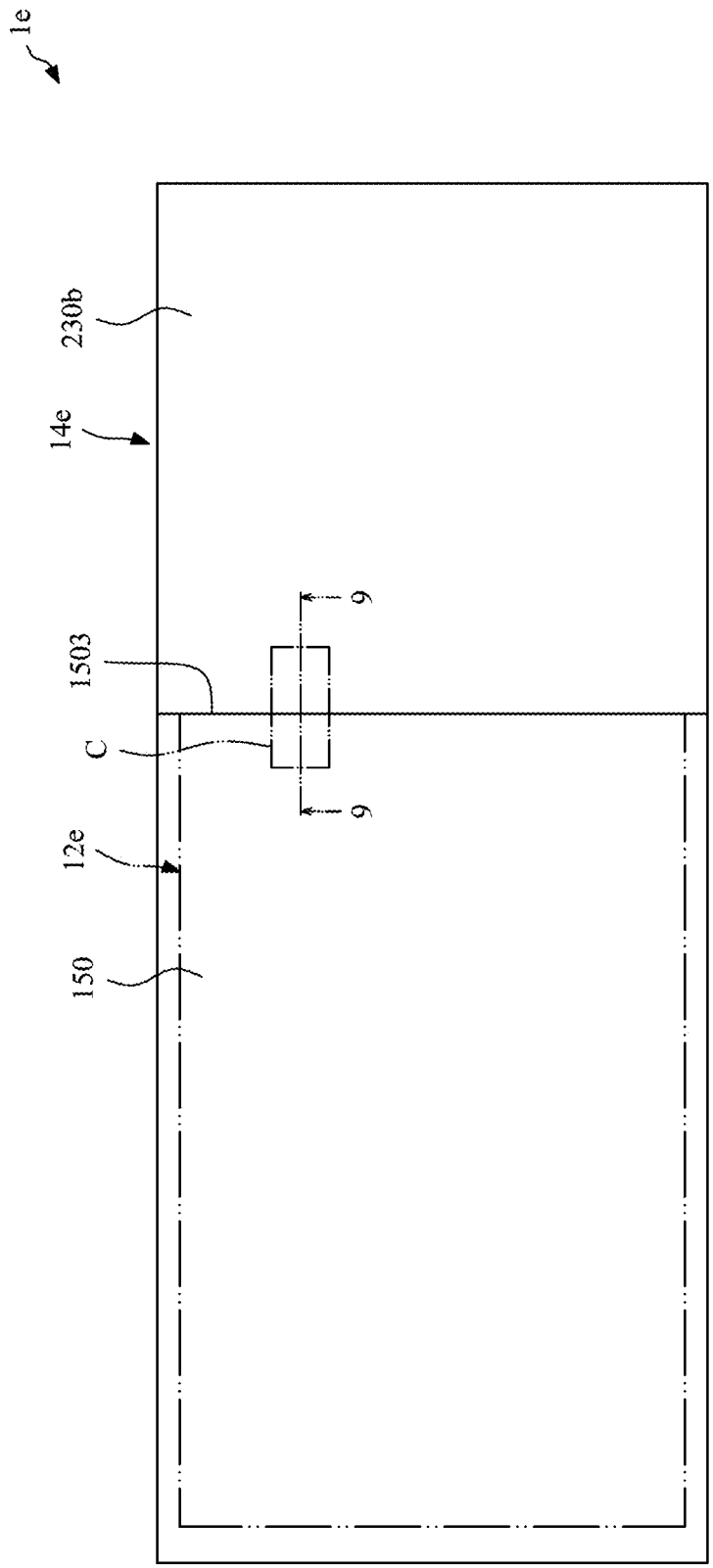
FIG. 8 illustrates a top view of a semiconductor device package in accordance with some embodiments of the present disclosure.
Figure 9:
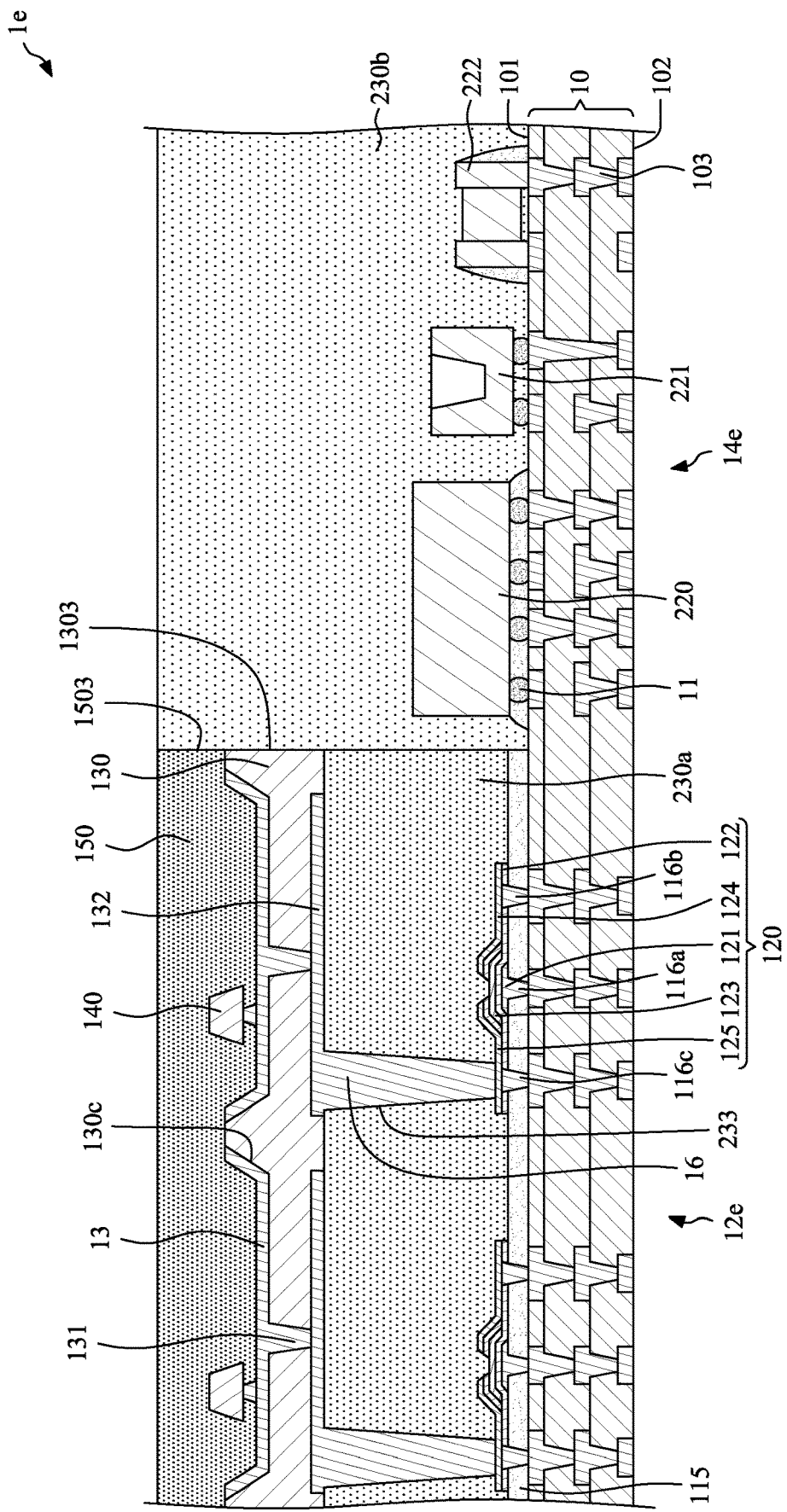
FIG. 9 illustrates an enlarged cross-sectional view taken along line 9-9 in a region "C" in FIG. 8.

FIG. 8 illustrates a top view of a semiconductor device package 1e in accordance with some embodiments of the present disclosure. FIG. 9 illustrates an enlarged cross-sectional view taken along line 9-9 in a region "C" in FIG. 8. The semiconductor device package 1e is similar to the semiconductor device package 1 in FIG. 1 and FIG. 2, and the differences therebetween are described below.

The semiconductor device package 1e includes a first encapsulant 230a and a second encapsulant 230b. The first encapsulant 230a covers the TFT module 12e, and the second encapsulant 230b covers the component mounting region 14e (including, for example, at least one first electronic component (such as a plurality of first electronic components 220, 221, 222)). The conductive vias 16 extend through the first encapsulant 230a. The upper substrate 130 is selectively or solely disposed on the first encapsulant 230a, and has a lateral side surface 1303. The protection layer 150 is selectively or solely disposed on the upper substrate 130, and has a lateral side surface 1503. Thus, each of the light emitting devices 140 is electrically connected to the TFT module 12e through the conductive via 16 extending through the first encapsulant 230a. As shown in FIG. 9, the second encapsulant 230b contacts the lateral side surface 1303 of the upper substrate 130 and the lateral side surface 1503 of the protection layer 150. In some embodiments, the second encapsulant 230b may not contact the lateral side surface 1303 of the upper substrate 130 and the lateral side surface 1503 of the protection layer 150. That is, there may be a gap between the second encapsulant 230b and the lateral side surface 1303 of the upper substrate 130 and the lateral side surface 1503 of the protection layer 150. Such gap may facilitate the bending the semiconductor device package 1e. Thus, the semiconductor device package 1e may be more flexible.

Figure 10:
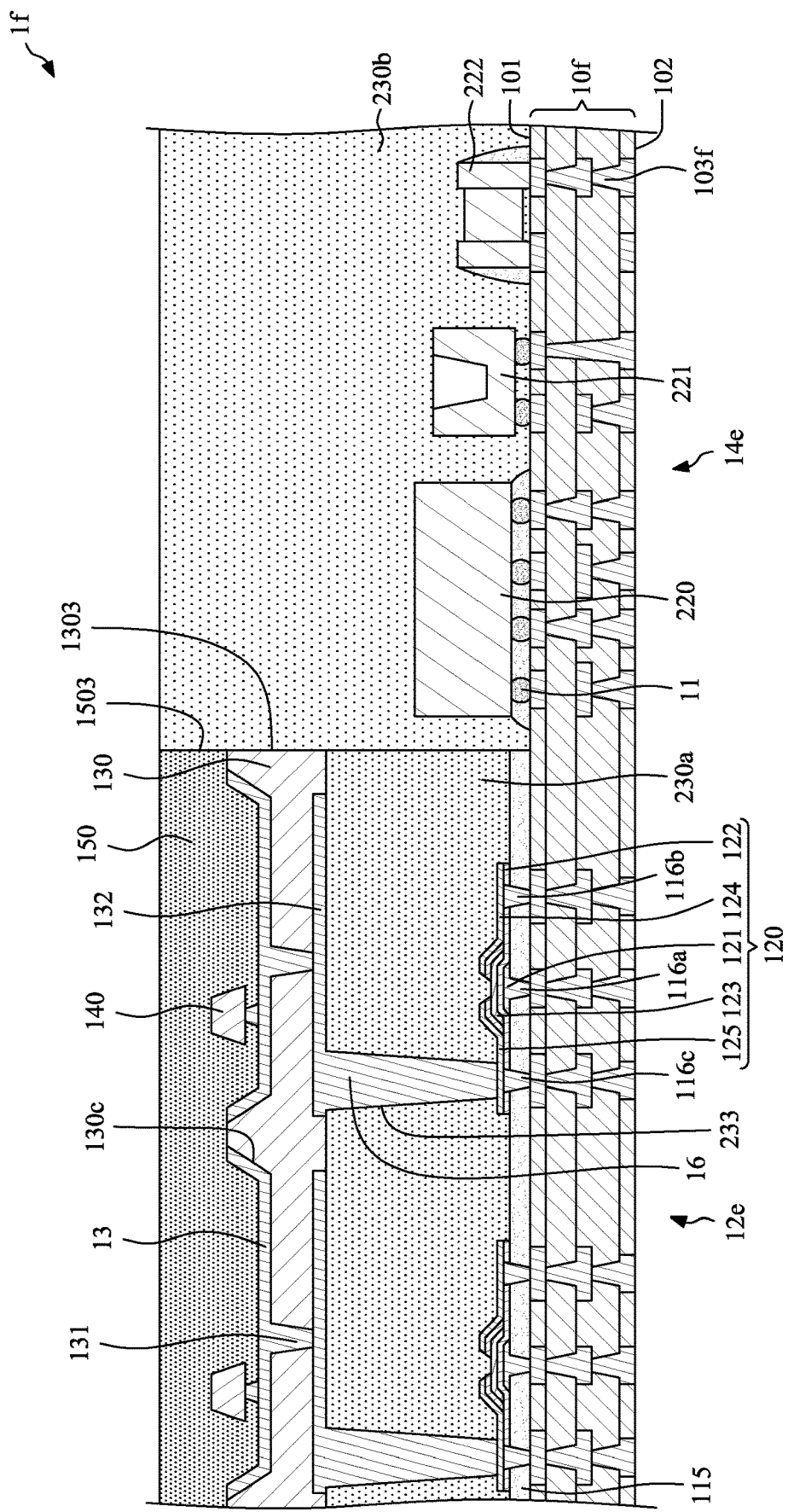
FIG. 10 illustrates an enlarged cross-sectional view of a semiconductor device package in accordance with some embodiments of the present disclosure.

FIG. 10 illustrates an enlarged cross-sectional view of a semiconductor device package 1f in accordance with some embodiments of the present disclosure. The semiconductor device package 1c is similar to the semiconductor device package 1e in FIG. 8 and FIG. 9 except for a structure of the main substrate 10f. As shown in FIG. 10, the main substrate 10f includes a plurality of interconnection vias 103f that tapers upward.

Figure 11:
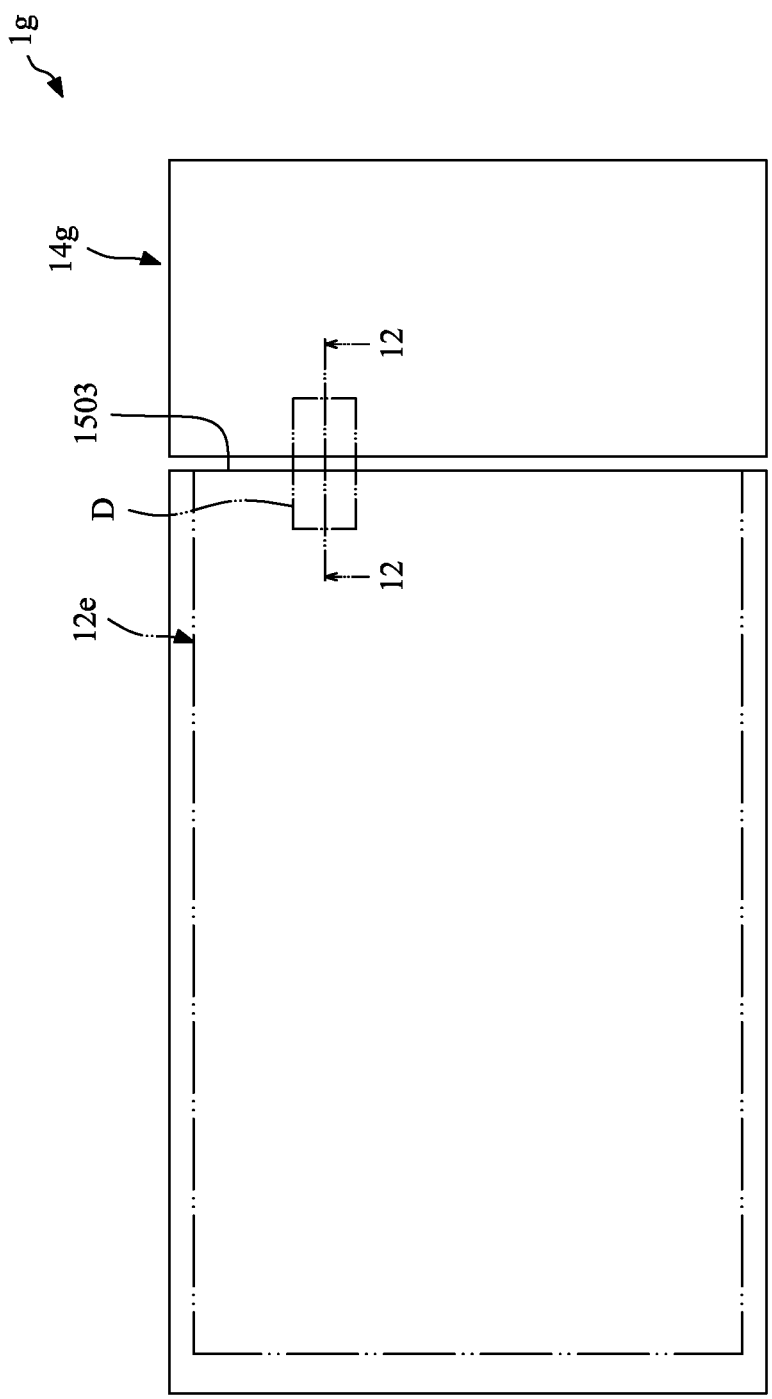
FIG. 11 illustrates a top view of a semiconductor device package in accordance with some embodiments of the present disclosure.
Figure 12:
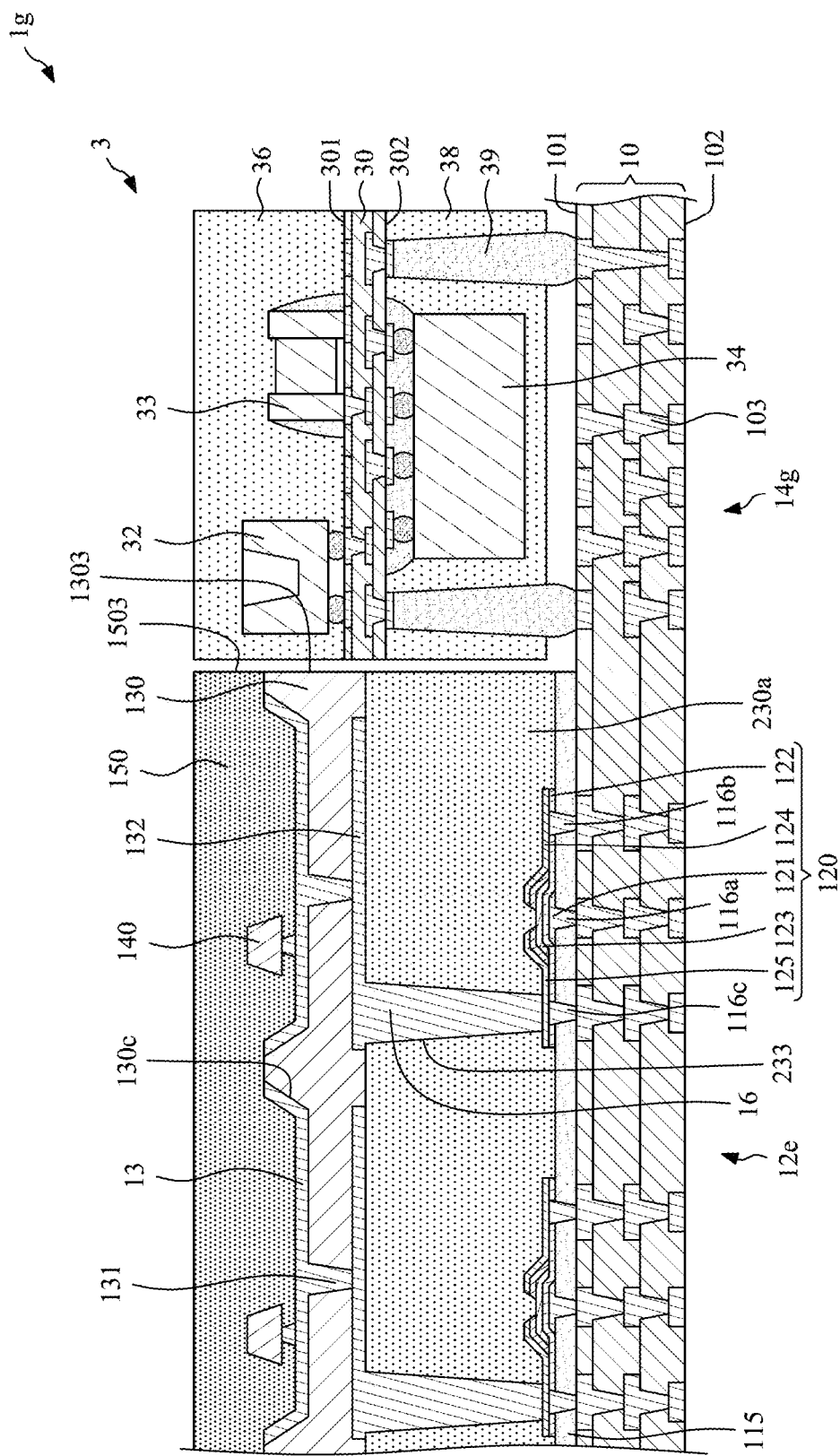
FIG. 12 illustrates an enlarged cross-sectional view taken along line 12-12 in a region "D" in FIG. 11.

FIG. 11 illustrates a top view of a semiconductor device package 1g in accordance with some embodiments of the present disclosure. FIG. 12 illustrates an enlarged cross-sectional view taken along line 12-12 in a region "D" in FIG. 11. The semiconductor device package 1g is similar to the semiconductor device package 1e in FIG. 8 and FIG. 9, and the differences therebetween are described below.

In the semiconductor device package 1g, at least one package structure 3 is disposed on the component mounting region 14g on the first surface 101 of the main substrate 10. The package structure 3 includes a package substrate 30, at least one first upper electronic component 32, 33, least one first lower electronic component 34, an upper package body 36, a lower package body 38 and at least one interconnection element 39. The package substrate 30 has an upper surface 301 and a lower surface 302 opposite to the upper surface 301. The first upper electronic components 32, 33 are electrically connected to the upper surface 301 of the package substrate 30. The first lower electronic component 34 is electrically connected to the lower surface 302 of the package substrate 30. The upper package body 36 may be a molding compound that covers the first upper electronic components 32, 33. The lower package body 38 may be a molding compound that coves the first lower electronic component 34. The interconnection element 39 (such as solder material or conductive bump) electrically connects the lower surface 302 of the package substrate 30 and the first surface 101 of the main substrate 10. The interconnection element 39 may be embedded in the lower package body 38. There may be a gap between the package structure 3 and the TFT module 12e, the first encapsulant 230a, the upper substrate 130 and the protection layer 150.

Figure 13:
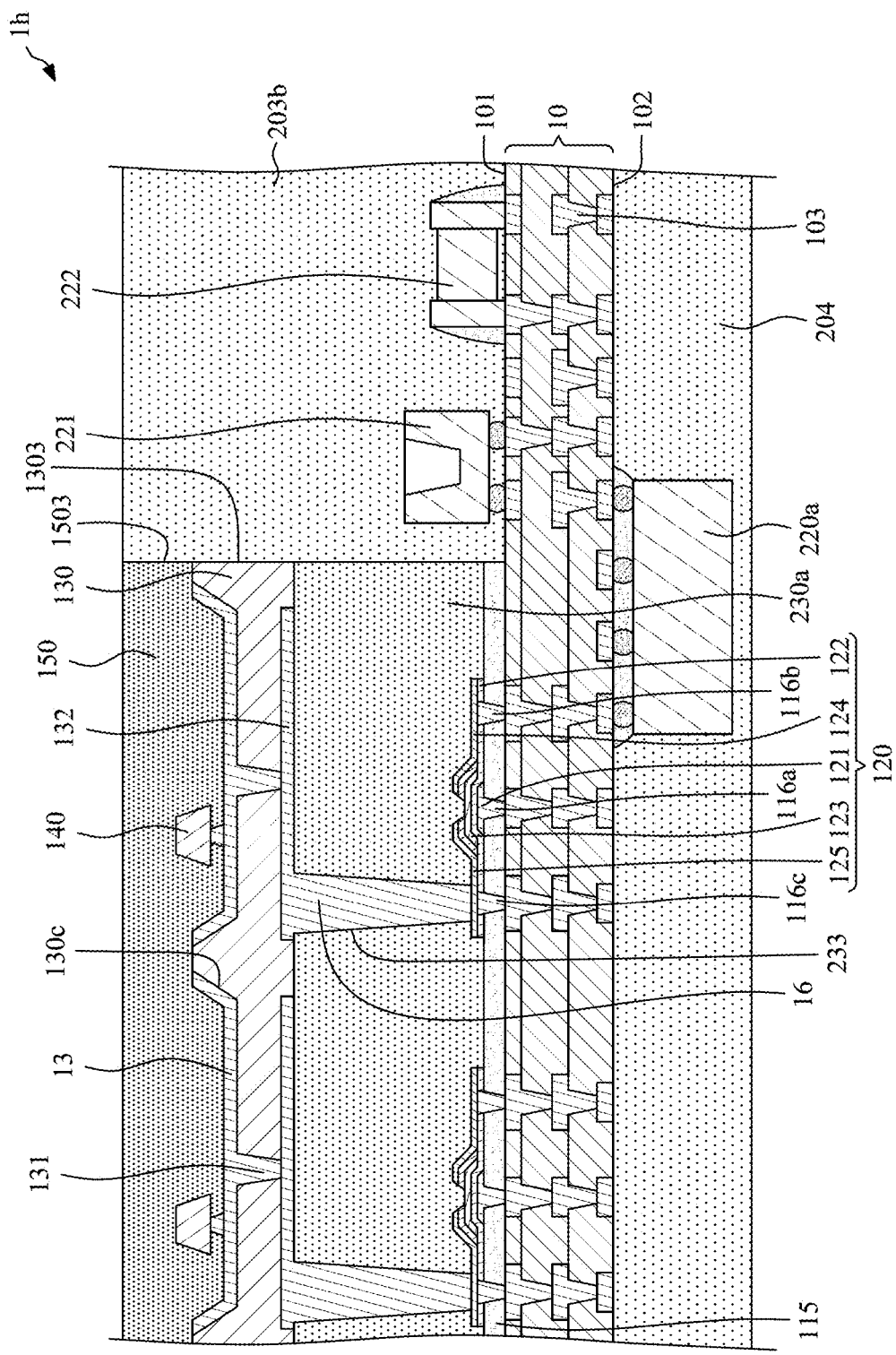
FIG. 13 illustrates an enlarged cross-sectional view of a semiconductor device package in accordance with some embodiments of the present disclosure.

FIG. 13 illustrates an enlarged cross-sectional view of a semiconductor device package 1h in accordance with some embodiments of the present disclosure. The semiconductor device package 1h is similar to the semiconductor device package 1e in FIG. 8 and FIG. 9, and the differences therebetween are described below. As shown in FIG. 13, the semiconductor device package 1h further includes at least one second electronic component 220a and a lower encapsulant 204. The second electronic component 220a is disposed adjacent to and electrically connected to the second surface 102 of the main substrate 10. The lower encapsulant 204 covers the second electronic component 220a.

Figure 14:
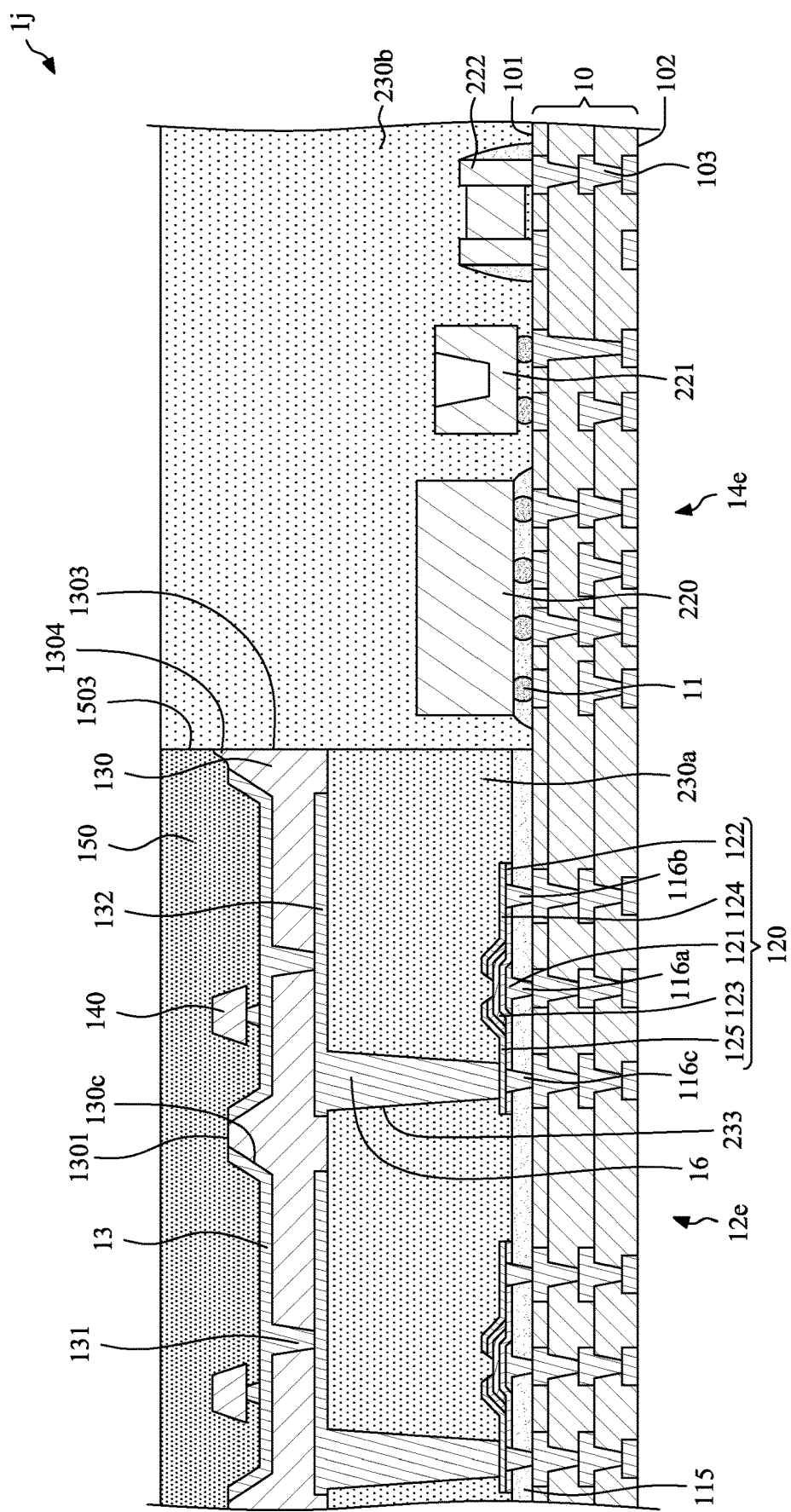
FIG. 14 illustrates an enlarged cross-sectional view of a semiconductor device package in accordance with some embodiments of the present disclosure.

FIG. 14 illustrates an enlarged cross-sectional view of a semiconductor device package 1j in accordance with some embodiments of the present disclosure. The semiconductor device package 1j is similar to the semiconductor device package 1e in FIG. 8 and FIG. 9, and the differences therebetween are described below. As shown in FIG. 14, the upper substrate 130 has an upper surface 1301. The upper substrate 130 includes a protrusion 1304 protruding from a periphery (or an edge) of the upper surface 1301 of the upper substrate 130. In some embodiments, a thickness of the protrusion 1304 may be greater than 10%, 30%, 50%, 80% or 100% of a thickness of the upper substrate 130, since the upper substrate 130 may be formed by spin coating and may be formed before the formation of the second encapsulant 203b.

Figure 15:
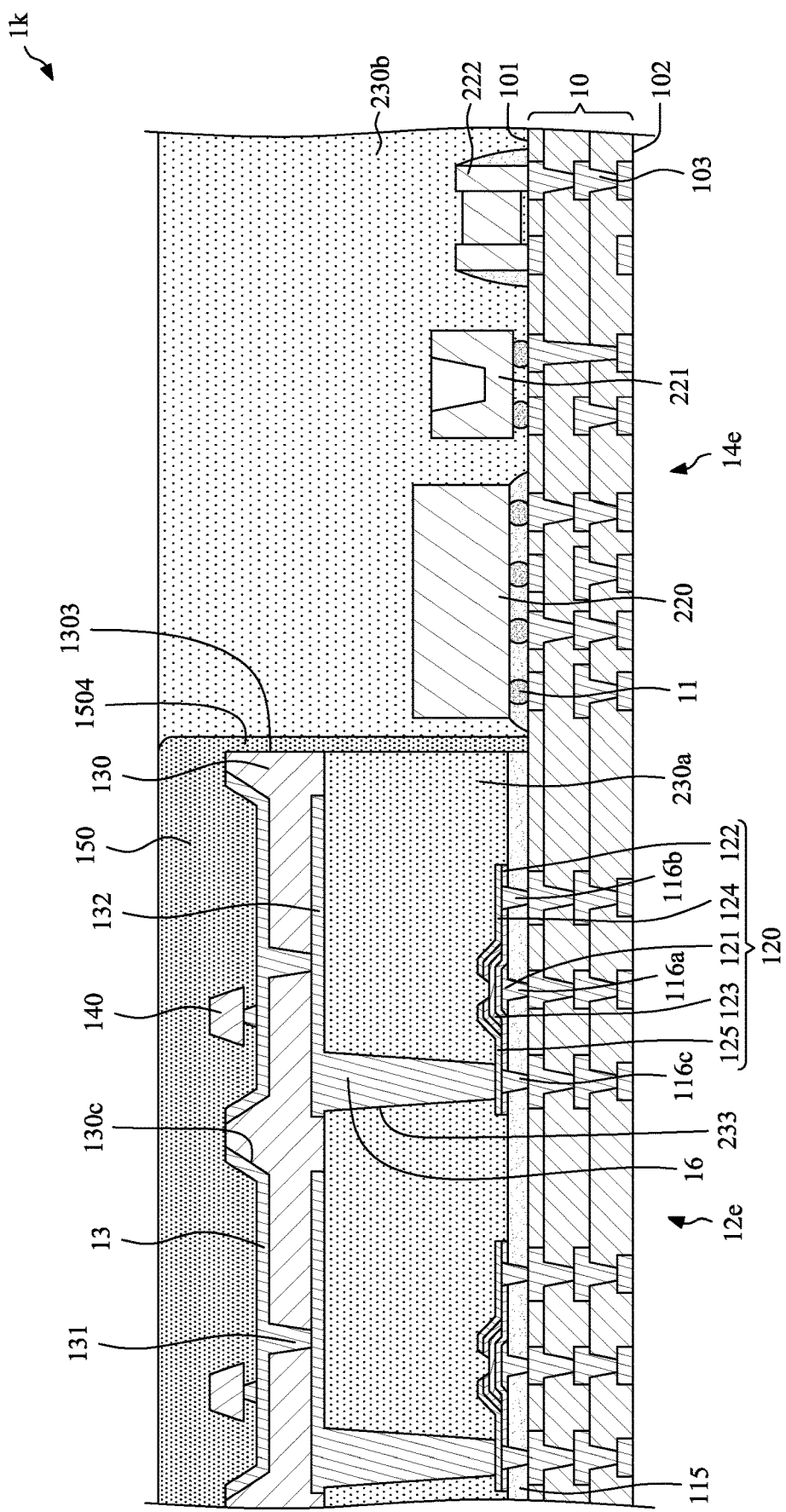
FIG. 15 illustrates an enlarged cross-sectional view of a semiconductor device package in accordance with some embodiments of the present disclosure.

FIG. 15 illustrates an enlarged cross-sectional view of a semiconductor device package 1k in accordance with some embodiments of the present disclosure. The semiconductor device package 1k is similar to the semiconductor device package 1e in FIG. 8 and FIG. 9, and the differences therebetween are described below. As shown in FIG. 15, a portion 1504 of the protection layer 150 may extend to cover the lateral side surface 1303 of the upper substrate 13 and the lateral side surface of the first encapsulant 203a, since the protection layer 150 may be formed by molding and may be formed before the formation of the second encapsulant 203b.

Figure 16:
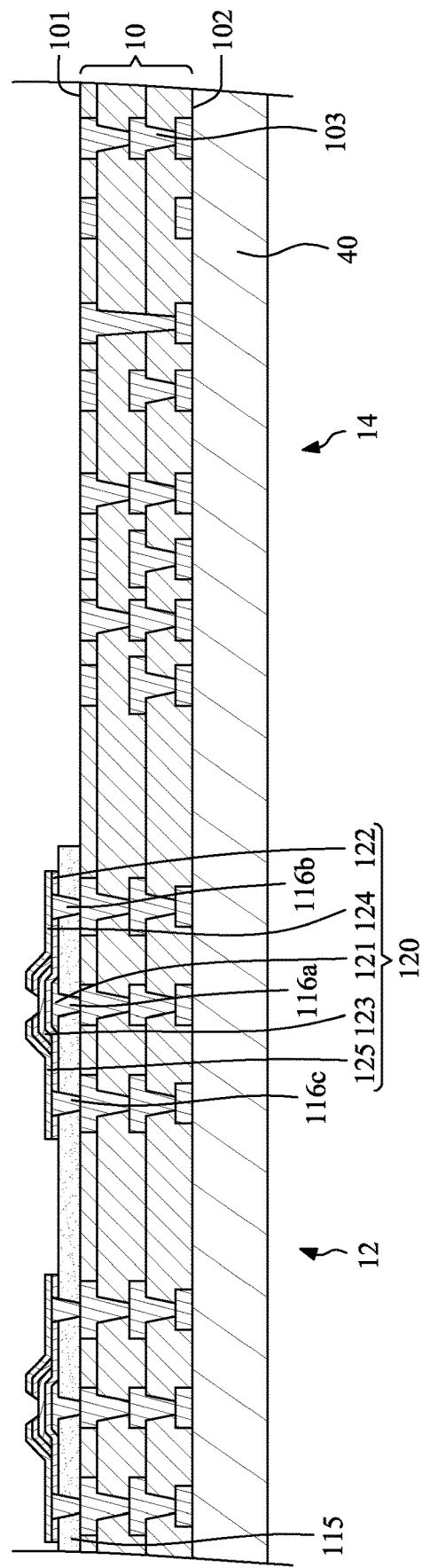
FIG. 16 illustrates one or more stages of an example of a method for manufacturing a semiconductor device package according to some embodiments of the present disclosure.
Figure 17:
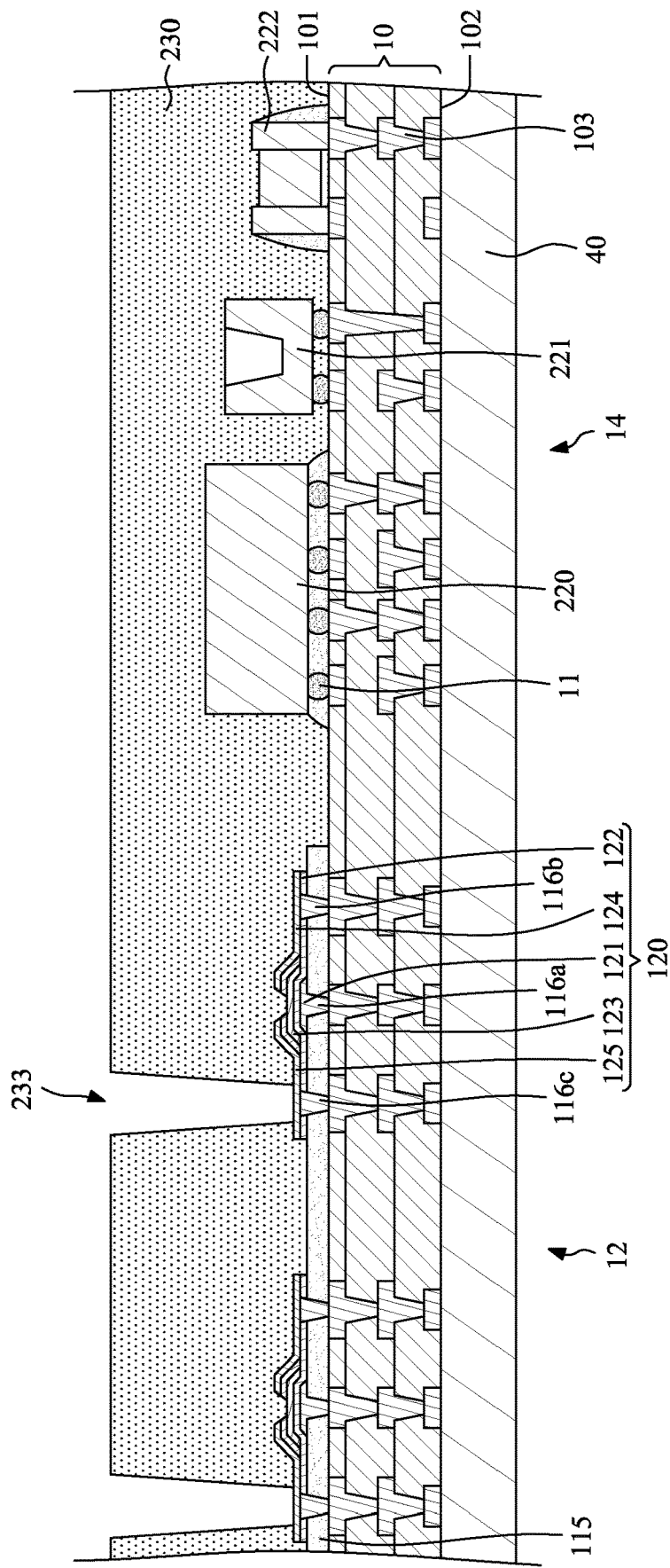
FIG. 17 illustrates one or more stages of an example of a method for manufacturing a semiconductor device package according to some embodiments of the present disclosure.
Figure 18:
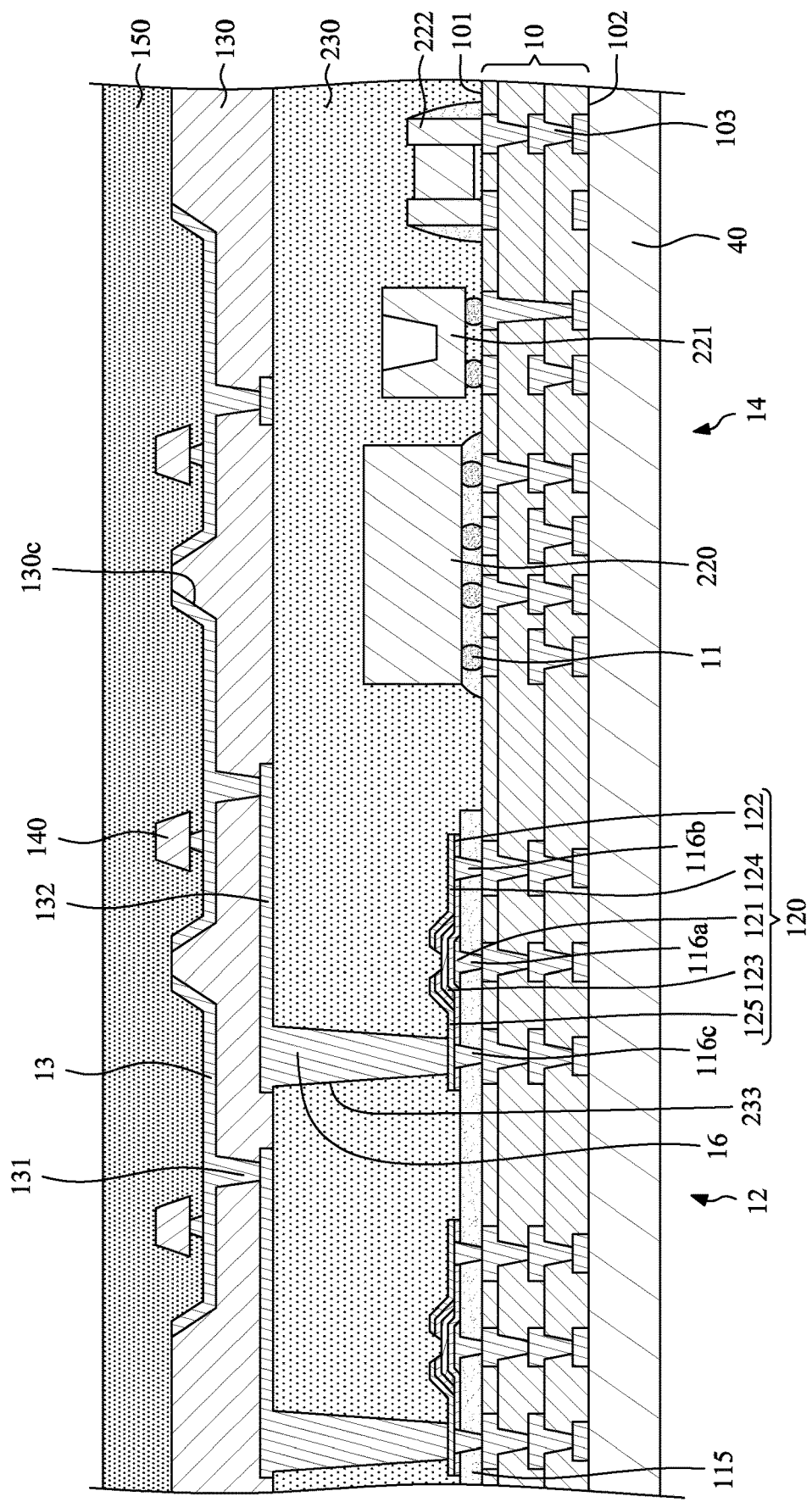
FIG. 18 illustrates one or more stages of an example of a method for manufacturing a semiconductor device package according to some embodiments of the present disclosure.

FIG. 16 through FIG. 18 illustrate a method for manufacturing a semiconductor device package according to some embodiments of the present disclosure. In some embodiments, the method is for manufacturing the semiconductor device package 1 shown in FIG. 1 and FIG. 2.

Referring to FIG. 16, a carrier 40 is provided. Then, a complete main substrate 10 is formed on the carrier 40. In some embodiments, the main substrate 10 may be a flexible substrate. The main substrate 10 may include an interconnection structure, such as a RDL or a grounding element. The main substrate 10 has a first surface 101 and a second surface 102 opposite to the first surface 101. Then, an insulation layer 115, a first inner via 116a, a second inner via 116b, a third inner via 116c and a TFT module 12 are formed on the first surface 101 of the substrate 10.

Referring to FIG. 17, at least one first electronic component (including, for example, a plurality of first electronic components 220, 221, 222) is/are disposed adjacent to and electrically connected to the first surface 101 of the main substrate 10. In some embodiments, the first electronic components 220, 221, 222 are disposed in a component mounting region 14 on the first surface 101 of the main substrate 10. Thus, the first electronic components 220, 221, 222 and the TFT module 12 are disposed side by side.

Then, an encapsulant 230 is formed or disposed on the first surface 101 of the main substrate 10 to cover the TFT module 12 and the first electronic components 220, 221, 222 concurrently. Then, a plurality of through holes 233 are formed in the encapsulant 230 to extend through the encapsulant 230 and expose a portion of the source 125 of the transistor 120 of the TFT module 12.

Referring to FIG. 18, a metal material is formed or disposed to fill the through holes 233 of the encapsulant 230 by, for example, plating, to form a plurality of conductive vias 16. Thus, the conductive vias 16 are electrically connected to the TFT module 12. The metal material on the top surface of the encapsulant 230 may be patterned to form a RDL 132. Thus, the conductive vias 16 and the RDL 132 may be formed integrally and concurrently. Then, an upper substrate 130 is formed or disposed on the encapsulant 230. The upper substrate 130 may include an interconnection structure (such as a circuit layer 13, an upper via 131 and the RDL 132) or a grounding element. In addition, the upper substrate 130 may define a plurality of cavities 130c. In some embodiments, the cavities 130c may be omitted.

Then, a plurality of light emitting devices 140 are disposed within a respective one of the cavities 130c of the upper substrate 130. In some embodiments, the cavities 130c may be omitted, and the light emitting devices 140 may be disposed on the top surface of the upper substrate 130. The light emitting devices 140 are electrically connected to the transistor 120 of the TFT module 12 through the substrate 130 (e.g., through the interconnection structure of the substrate 130) and the conductive vias 16. Then, a protection layer 150 is formed or disposed on the upper substrate 130 to cover and protect the light emitting devices 140.

Then, the carrier 40 is removed. Then, a singulation process is conducted to obtain a plurality of semiconductor device packages 1 as shown in FIG. 1 and FIG. 2.

Figure 19:
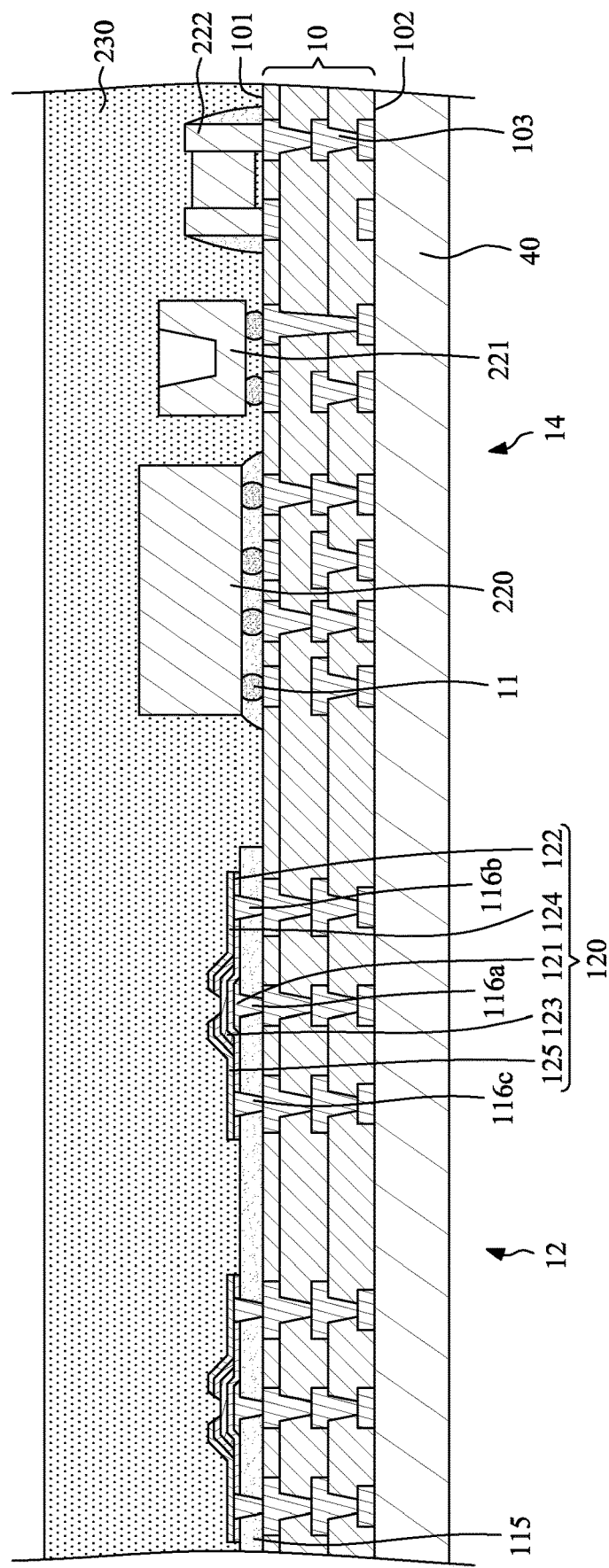
FIG. 19 illustrates one or more stages of an example of a method for manufacturing a semiconductor device package according to some embodiments of the present disclosure.
Figure 20:
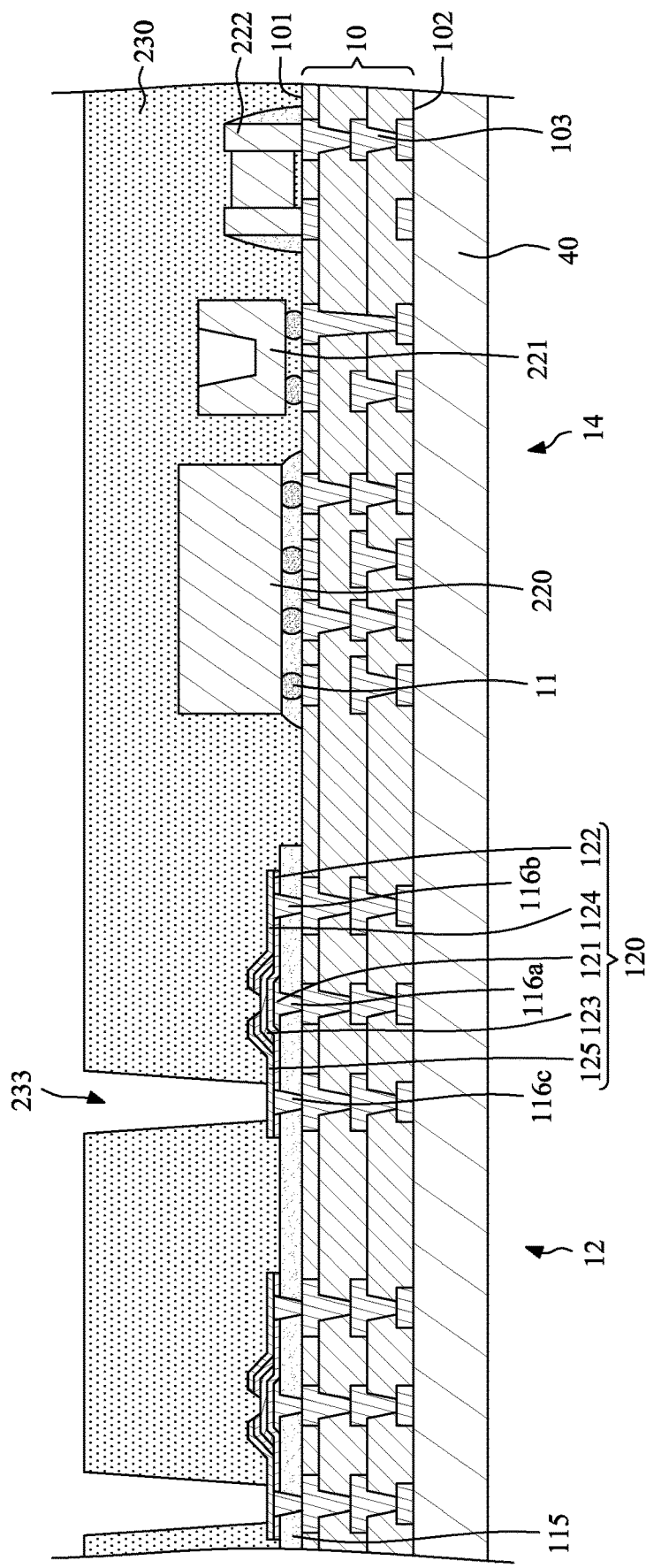
FIG. 20 illustrates one or more stages of an example of a method for manufacturing a semiconductor device package according to some embodiments of the present disclosure.
Figure 21:
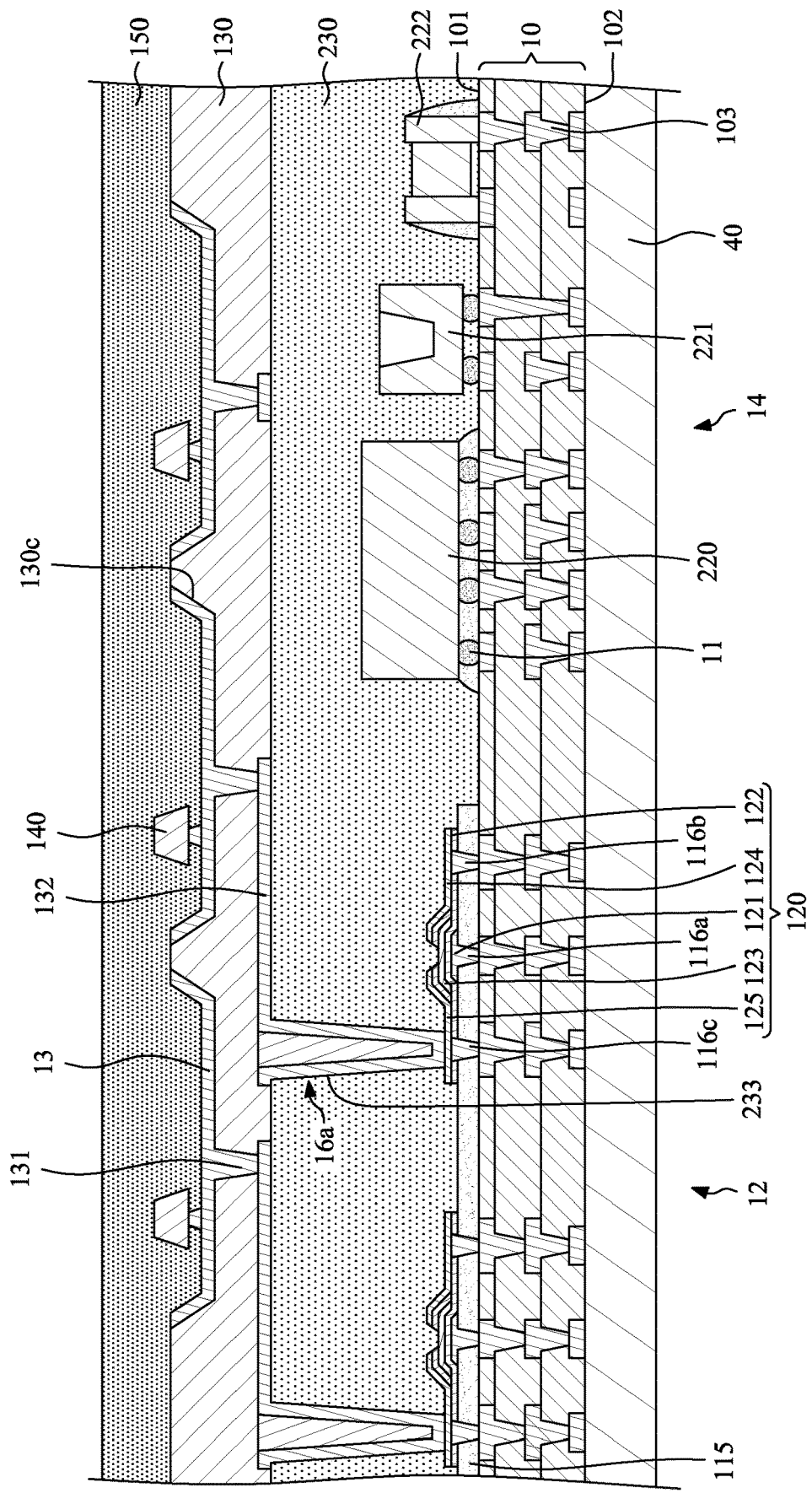
FIG. 21 illustrates one or more stages of an example of a method for manufacturing a semiconductor device package according to some embodiments of the present disclosure.

FIG. 19 through FIG. 21 illustrate a method for manufacturing a semiconductor device package according to some embodiments of the present disclosure. In some embodiments, the method is for manufacturing the semiconductor device package 1a shown in FIG. 3. The initial stages of the illustrated process are the same as, or similar to, the stage illustrated in FIG. 16. FIG. 19 depicts a stage subsequent to that depicted in FIG. 16.

Referring to FIG. 19, at least one first electronic component (including, for example, a plurality of first electronic components 220, 221, 222) is/are disposed adjacent to and electrically connected to the first surface 101 of the main substrate 10. Then, an encapsulant 230 is formed or disposed on the first surface 101 of the main substrate 10 to cover the TFT module 12 and the first electronic components 220, 221, 222 concurrently.

Referring to FIG. 20, a plurality of through holes 233 are formed in the encapsulant 230 to extend through the encapsulant 230 and expose a portion of the source 125 of the transistor 120 of the TFT module 12.

Referring to FIG. 21, a metal layer is formed or disposed on the through holes 233 of the encapsulant 230 to define a plurality of central holes. The metal layer on the top surface of the encapsulant 230 may be patterned to form a RDL 132. Then, an isolation material fills the central holes to form a plurality of conductive vias 16a. Thus, the conductive vias 16a are electrically connected to the TFT module 12.

Then, an upper substrate 130 is formed or disposed on the encapsulant 230. The upper substrate 130 may define a plurality of cavities 130c. Then, a plurality of light emitting devices 140 are disposed within a respective one of the cavities 130c of the upper substrate 130. The light emitting devices 140 are electrically connected to the transistor 120 of the TFT module 12 through the substrate 130 (e.g., through the interconnection structure of the substrate 130) and the conductive vias 16a. Then, a protection layer 150 is formed or disposed on the upper substrate 130 and within the cavity 130c of the upper substrate 130.

Then, the carrier 40 is removed. Then, a singulation process is conducted to obtain a plurality of semiconductor device packages 1a as shown in FIG. 3.

Figure 22:
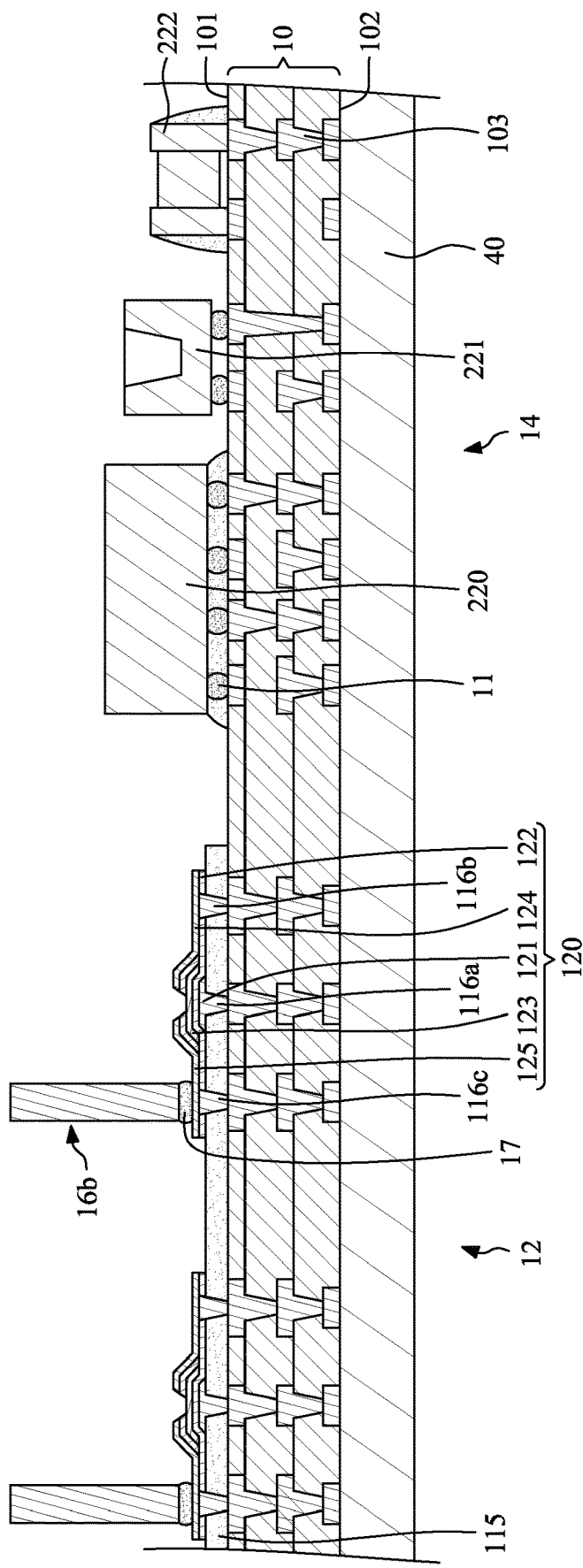
FIG. 22 illustrates one or more stages of an example of a method for manufacturing a semiconductor device package according to some embodiments of the present disclosure.
Figure 23:
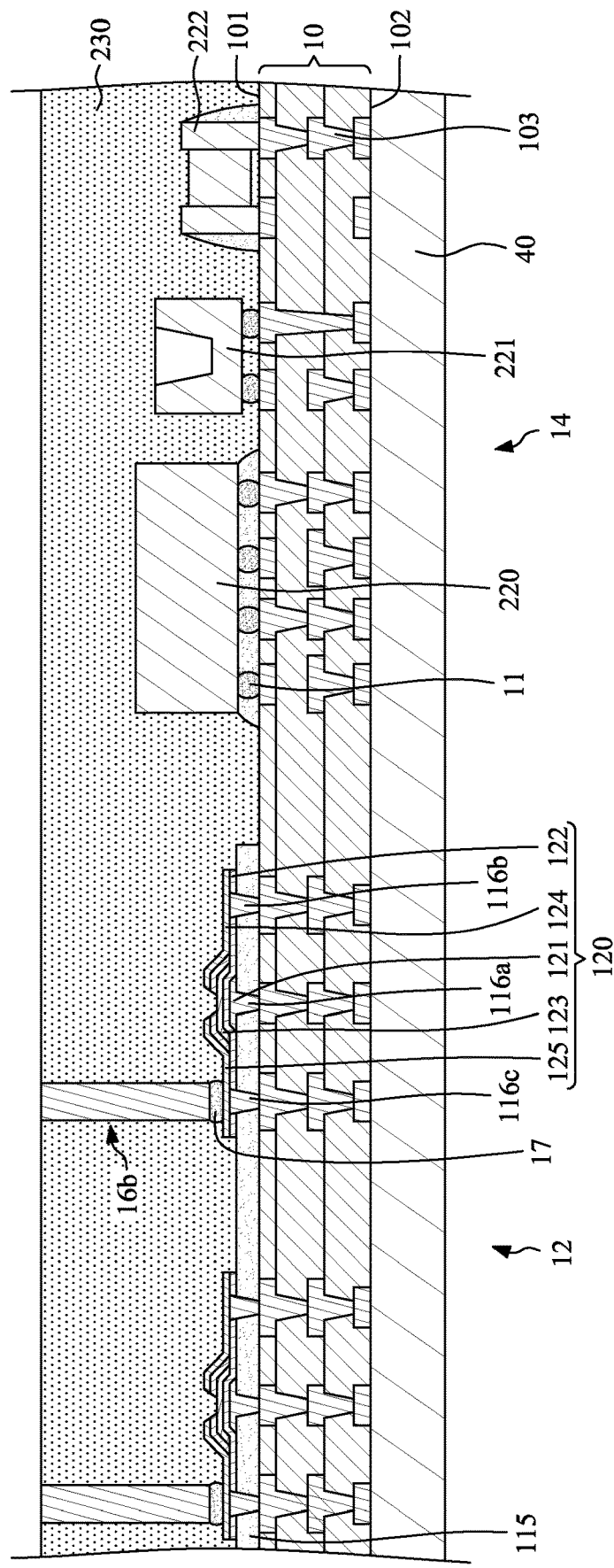
FIG. 23 illustrates one or more stages of an example of a method for manufacturing a semiconductor device package according to some embodiments of the present disclosure.
Figure 24:
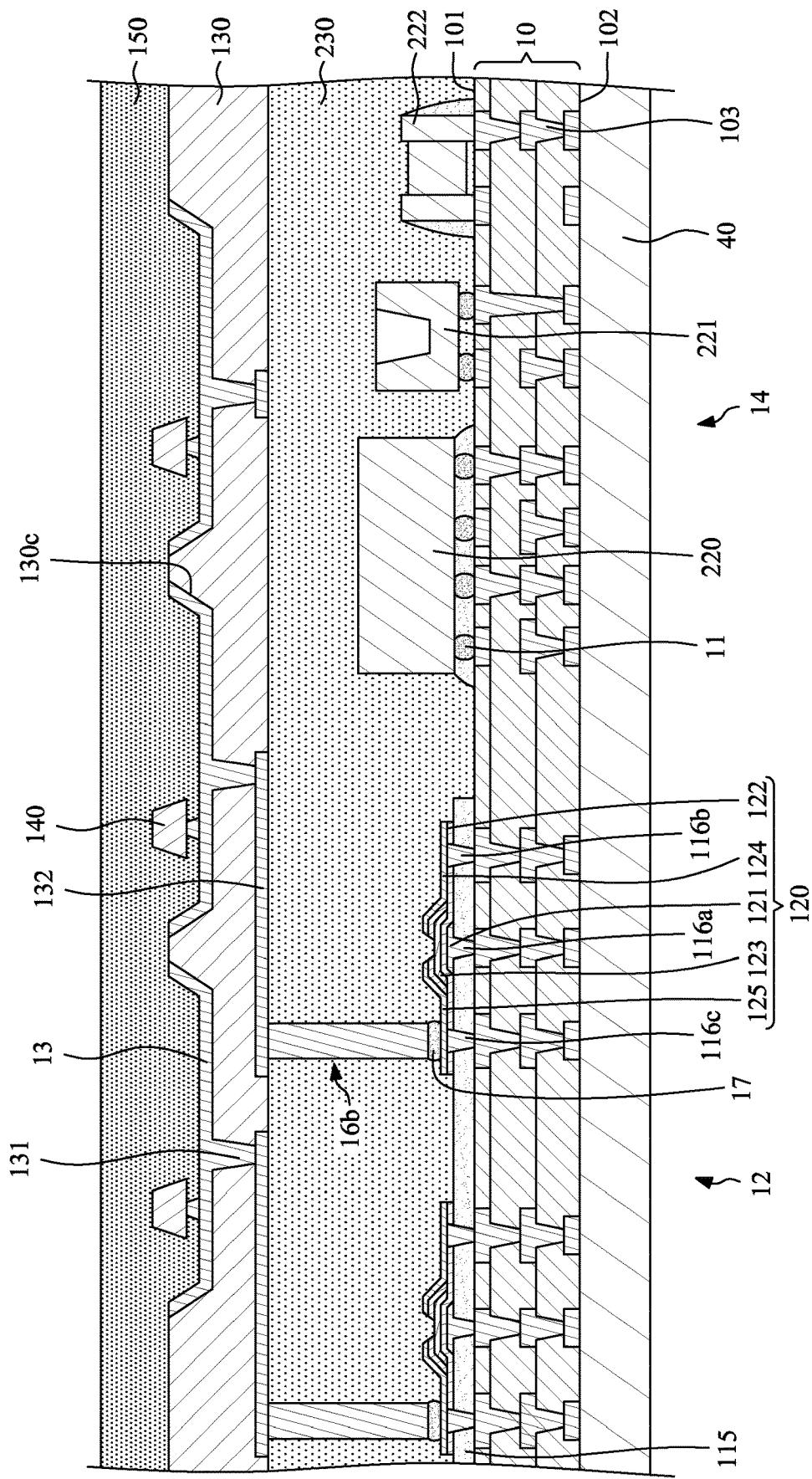
FIG. 24 illustrates one or more stages of an example of a method for manufacturing a semiconductor device package according to some embodiments of the present disclosure.

FIG. 22 through FIG. 24 illustrate a method for manufacturing a semiconductor device package according to some embodiments of the present disclosure. In some embodiments, the method is for manufacturing the semiconductor device package 1b shown in FIG. 4. The initial stages of the illustrated process are the same as, or similar to, the stage illustrated in FIG. 16. FIG. 22 depicts a stage subsequent to that depicted in FIG. 16.

Referring to FIG. 22, at least one first electronic component (including, for example, a plurality of first electronic components 220, 221, 222) is/are disposed adjacent to and electrically connected to the first surface 101 of the main substrate 10. Then, a plurality of conductive vias 16b are disposed on the TFT module 12 to contact and electrically connect the source 125 of the transistor 120 of the TFT module 12. In some embodiments, the conductive via 16b may be a solid cylinder, a pillar or a pin, and is attached to the TFT module 12 through a connecting material 17 by surface mounting technology (SMT). However, the conductive vias 16b may be formed by optical lithography process and plating. Thus, the connecting material 17 may be omitted.

Referring to FIG. 23, an encapsulant 230 is formed or disposed on the first surface 101 of the main substrate 10 to cover the TFT module 12, the first electronic components 220, 221, 222 and the conductive vias 16b concurrently. The top end of each of the conductive vias 16b is exposed from a top surface of the encapsulant 230.

Referring to FIG. 24, an upper substrate 130 is formed or disposed on the encapsulant 230. The upper substrate 130 may define a plurality of cavities 130c. Then, a plurality of light emitting devices 140 are disposed within a respective one of the cavities 130c of the upper substrate 130. The light emitting devices 140 are electrically connected to the transistor 120 of the TFT module 12 through the substrate 130 (e.g., through the interconnection structure of the substrate 130) and the conductive vias 16b. Then, a protection layer 150 is formed or disposed on the upper substrate 130 and within the cavity 130c of the upper substrate 130.

Then, the carrier 40 is removed. Then, a singulation process is conducted to obtain a plurality of semiconductor device packages 1b as shown in FIG. 4.

FIG. 25 through FIG. 28 illustrate a method for manufacturing a semiconductor device package according to some embodiments of the present disclosure. In some embodiments, the method is for manufacturing the semiconductor device package 1c shown in FIG. 5.

Figure 25:
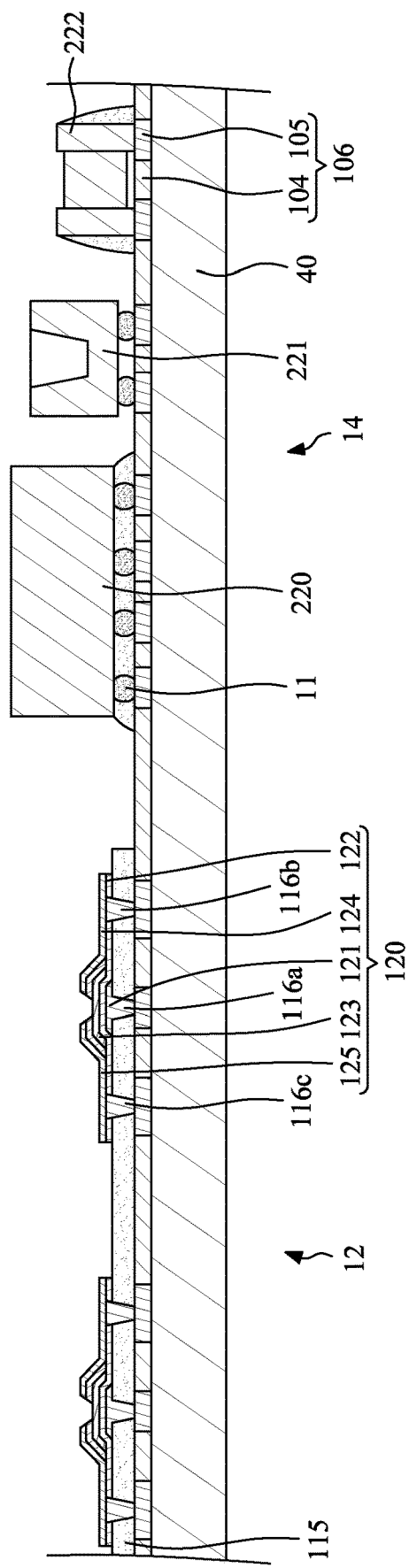
FIG. 25 illustrates one or more stages of an example of a method for manufacturing a semiconductor device package according to some embodiments of the present disclosure.

Referring to FIG. 25, a carrier 40 is provided. Then, a portion 106 of a main substrate is formed on the carrier 40. In some embodiments, such portion 106 of the main substrate may include a dielectric layer 104 and a circuit layer 105 embedded in the dielectric layer 104. Then, an insulation layer 115, a first inner via 116a, a second inner via 116b, a third inner via 116c and a TFT module 12 are formed on a top surface of such portion 106 (including the dielectric layer 104 and the circuit layer 105).

Figure 26:
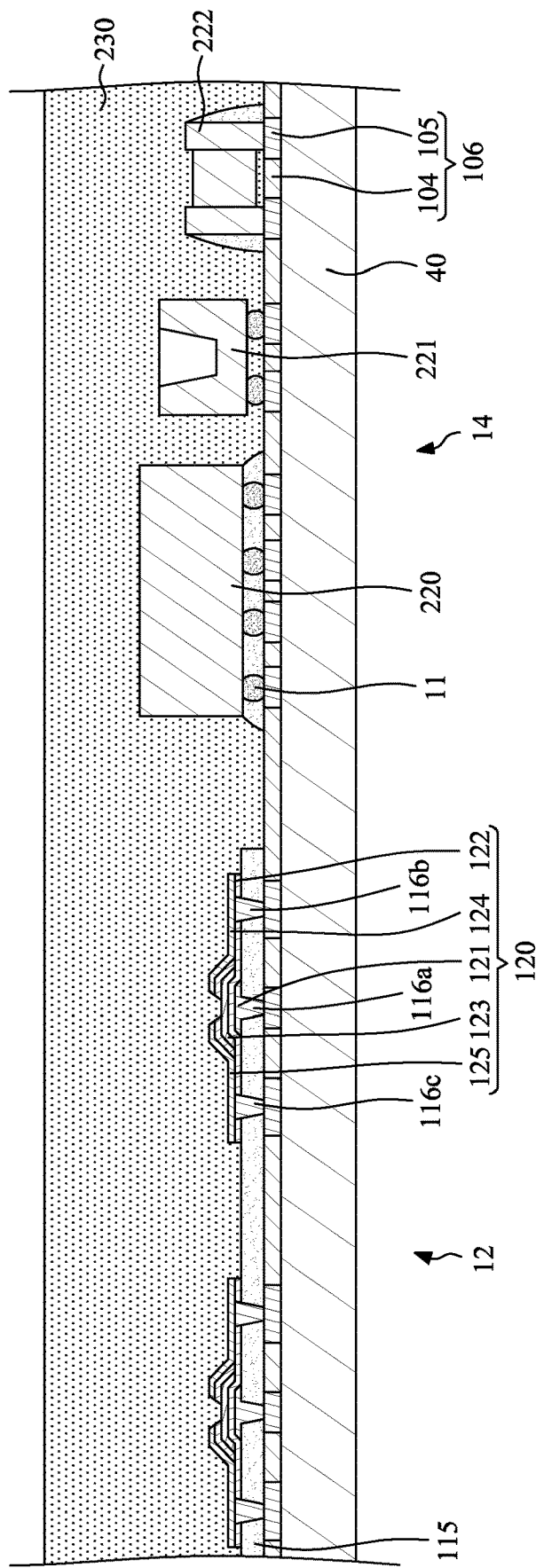
FIG. 26 illustrates one or more stages of an example of a method for manufacturing a semiconductor device package according to some embodiments of the present disclosure.

Referring to FIG. 26, at least one first electronic component (including, for example, a plurality of first electronic components 220, 221, 222) is/are disposed adjacent to and electrically connected to the top surface of the portion 106. Then, an encapsulant 230 is formed or disposed on the top surface of the portion 106 to cover the TFT module 12 and the first electronic components 220, 221, 222 concurrently.

Figure 27:
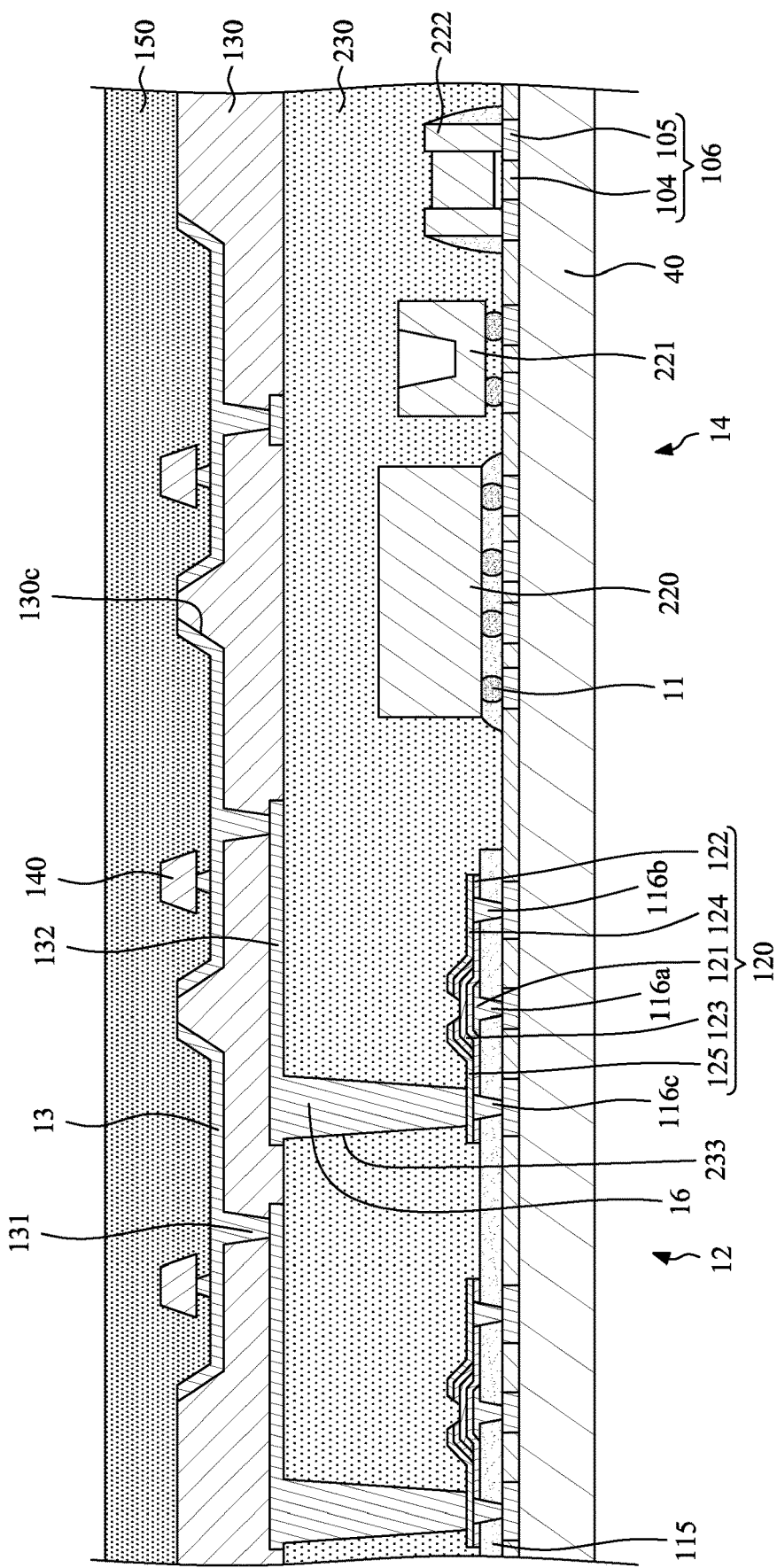
FIG. 27 illustrates one or more stages of an example of a method for manufacturing a semiconductor device package according to some embodiments of the present disclosure.

Referring to FIG. 27, a plurality of conductive vias 16 are formed to extend through the encapsulant 230 and electrically connect the TFT module 12. Then, an upper substrate 130 is formed or disposed on the encapsulant 230. Then, a plurality of light emitting devices 140 are disposed on the upper substrate 130. The light emitting devices 140 are electrically connected to the transistor 120 of the TFT module 12 through the substrate 130 and the conductive vias 16. Then, a protection layer 150 is formed or disposed on the upper substrate 130 to cover and protect the light emitting devices 140.

Figure 28:
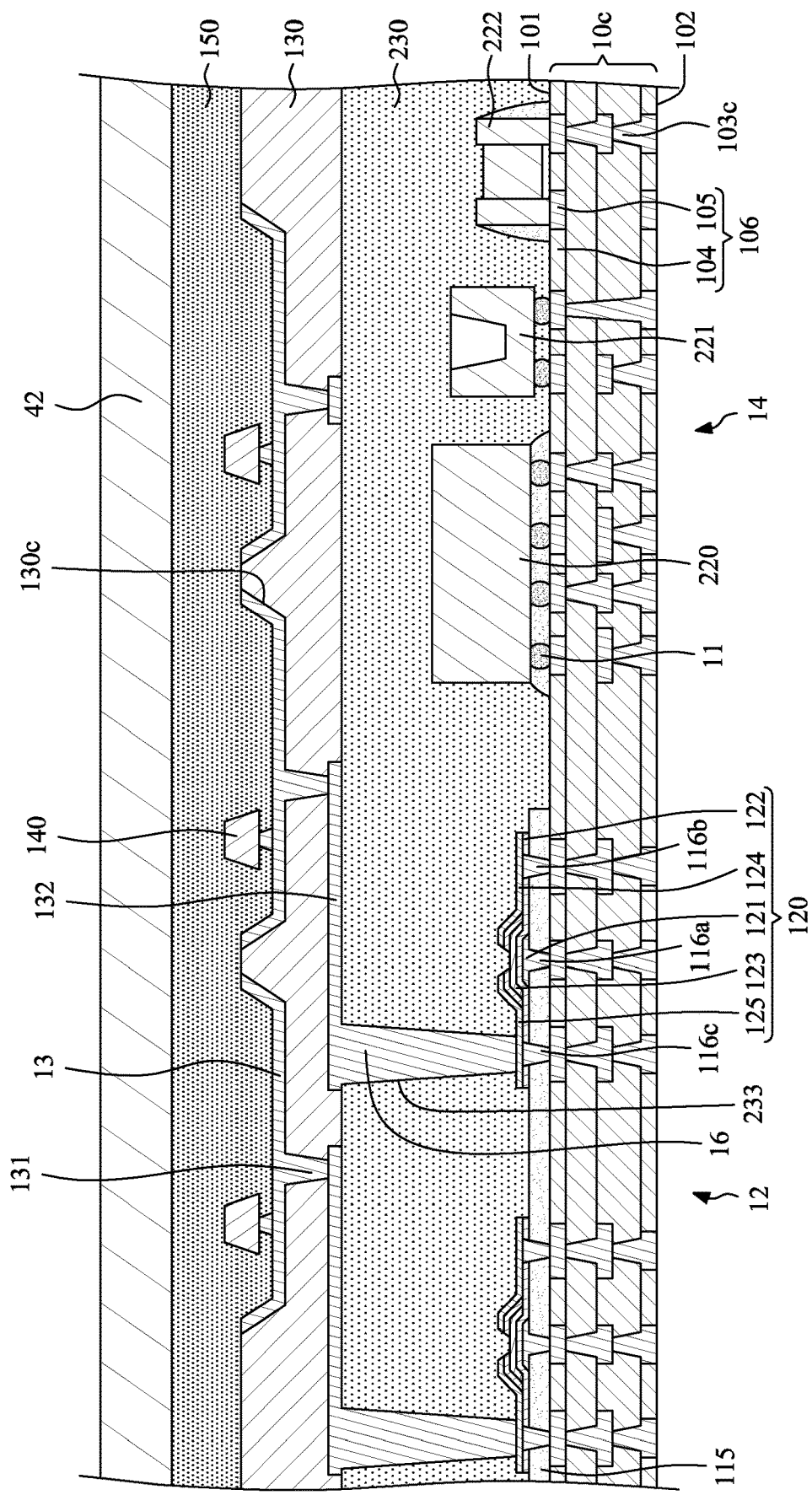
FIG. 28 illustrates one or more stages of an example of a method for manufacturing a semiconductor device package according to some embodiments of the present disclosure.

Referring to FIG. 28, a carrier 42 is attached to the protection layer 150, and the carrier 40 is removed. Then, at least one dielectric layer and at least one circuit layer are formed on the portion 106 to form a complete main substrate 10c. The interconnection vias 103c of the main substrate 10c tapers upward.

Then, the carrier 42 is removed. Then, a singulation process is conducted to obtain a plurality of semiconductor device packages 1c as shown in FIG. 5.

Figure 29:
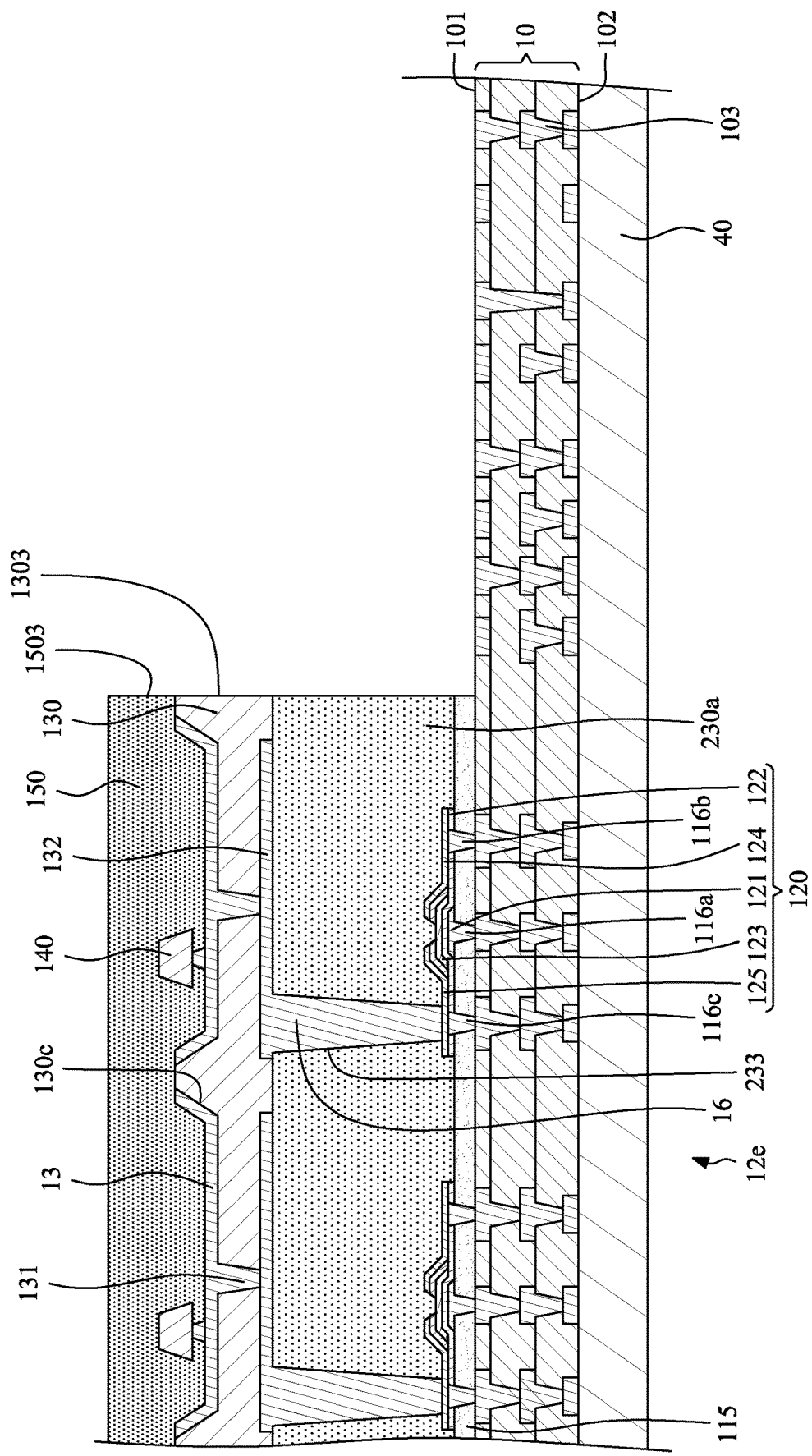
FIG. 29 illustrates one or more stages of an example of a method for manufacturing a semiconductor device package according to some embodiments of the present disclosure.
Figure 30:
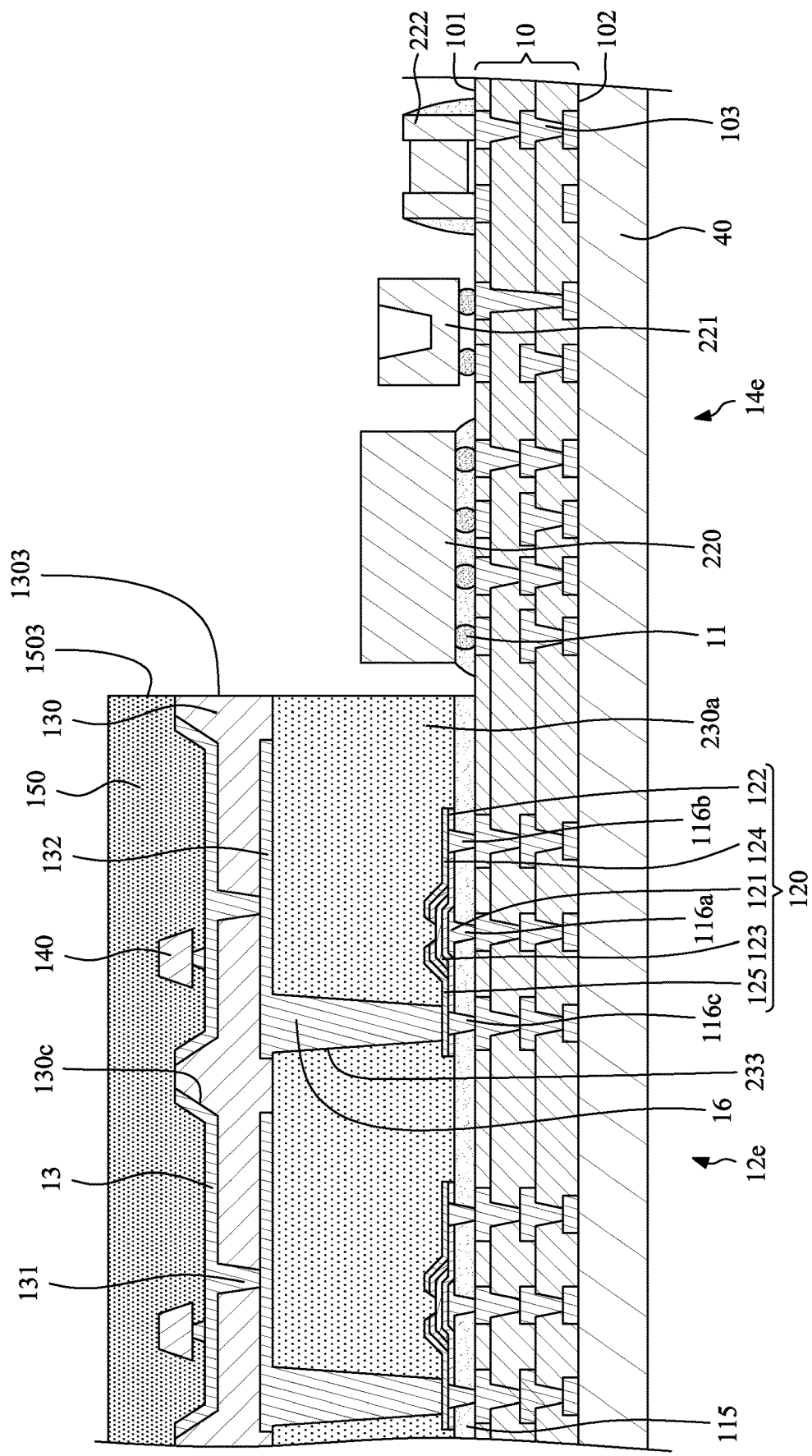
FIG. 30 illustrates one or more stages of an example of a method for manufacturing a semiconductor device package according to some embodiments of the present disclosure.

FIG. 29 through FIG. 30 illustrate a method for manufacturing a semiconductor device package according to some embodiments of the present disclosure. In some embodiments, the method is for manufacturing the semiconductor device package 1e shown in FIG. 8 and FIG. 9. The initial stages of the illustrated process are the same as, or similar to, the stage illustrated in FIG. 16. FIG. 29 depicts a stage subsequent to that depicted in FIG. 16.

Referring to FIG. 29, a first encapsulant 230a is formed or disposed on the first surface 101 of the main substrate 10 to cover the TFT module 12. Then, a plurality of conductive vias 16 extending through the first encapsulant 230a are formed. Then, an upper substrate 130 is formed or disposed on the first encapsulant 230a. Then, a plurality of light emitting devices 140 are disposed on the upper substrate 130, and electrically connected to the transistor 120 of the TFT module 12 through the conductive vias 16. Then, a protection layer 150 is formed or disposed on the upper substrate 130 to cover and protect the light emitting devices 140.

Referring to FIG. 30, at least one first electronic component (including, for example, a plurality of first electronic components 220, 221, 222) is/are disposed adjacent to and electrically connected to the first surface 101 of the main substrate 10. Then, a second encapsulant 230b are formed to cover the at least one first electronic component (such as a plurality of first electronic components 220, 221, 222)). The second encapsulant 230b contacts the lateral side surface 1303 of the upper substrate 130 and the lateral side surface 1503 of the protection layer 150.

Then, the carrier 40 is removed. Then, a singulation process is conducted to obtain a plurality of semiconductor device packages 1e as shown in FIG. 8 and FIG. 9.

Figure 31:
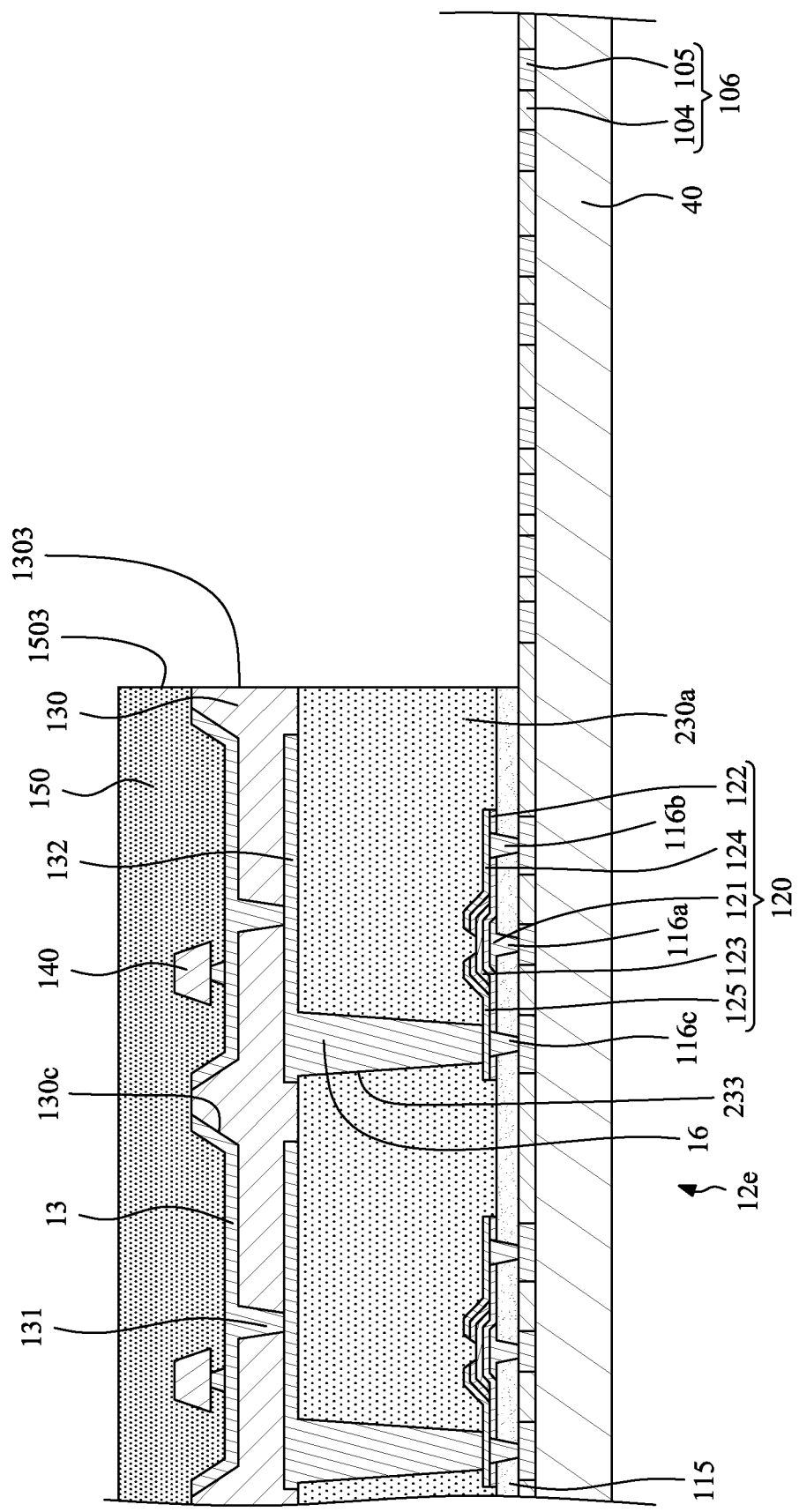
FIG. 31 illustrates one or more stages of an example of a method for manufacturing a semiconductor device package according to some embodiments of the present disclosure.
Figure 32:
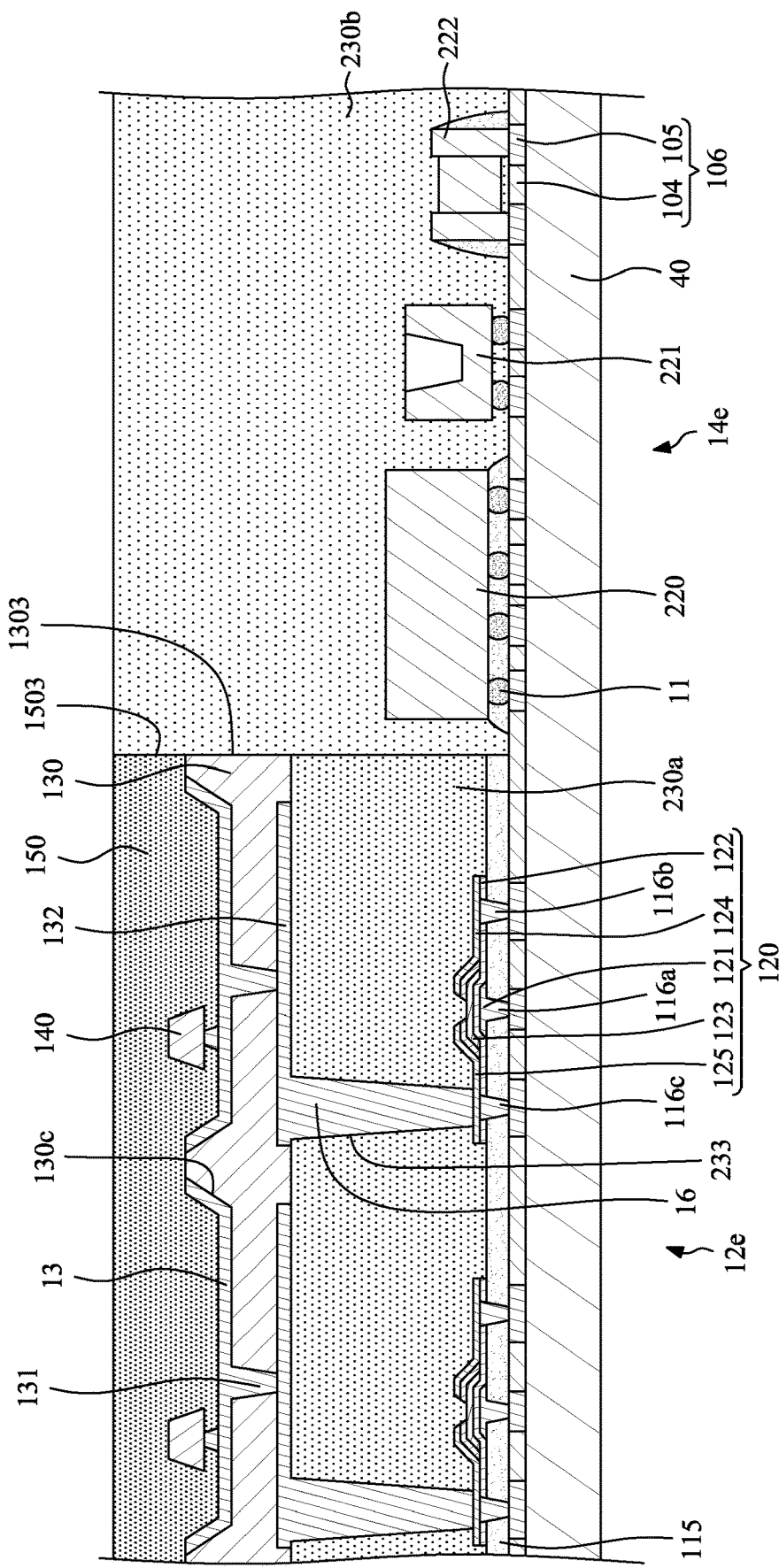
FIG. 32 illustrates one or more stages of an example of a method for manufacturing a semiconductor device package according to some embodiments of the present disclosure.
Figure 33:
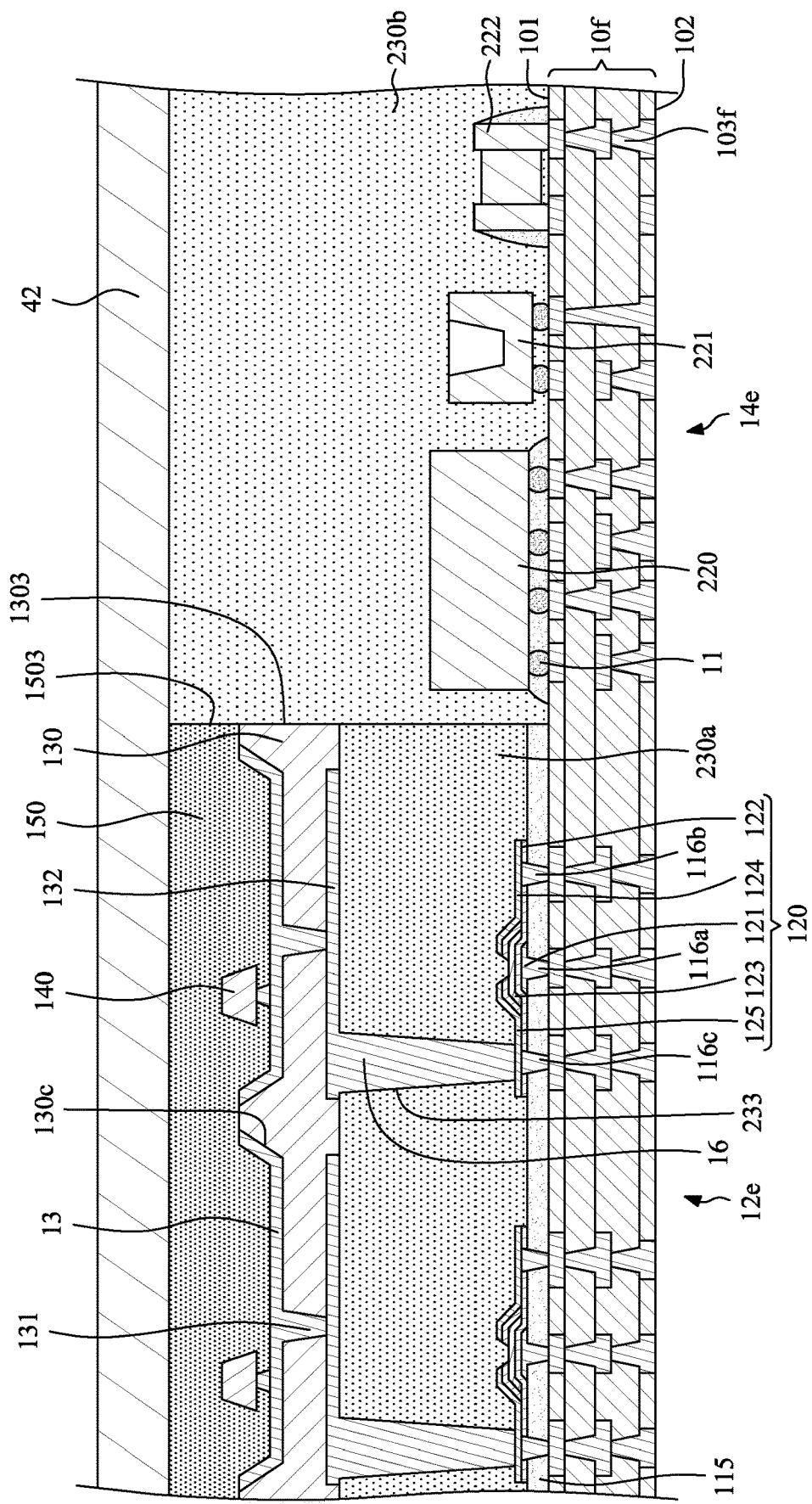
FIG. 33 illustrates one or more stages of an example of a method for manufacturing a semiconductor device package according to some embodiments of the present disclosure.

FIG. 31 through FIG. 33 illustrate a method for manufacturing a semiconductor device package according to some embodiments of the present disclosure. In some embodiments, the method is for manufacturing the semiconductor device package if shown in FIG. 10.

Referring to FIG. 31, a carrier 40 is provided. Then, a portion 106 of a main substrate is formed on the carrier 40. In some embodiments, such portion 106 of the main substrate may include a dielectric layer 104 and a circuit layer 105 embedded in the dielectric layer 104. Then, an insulation layer 115, a first inner via 116a, a second inner via 116b, a third inner via 116c and a TFT module 12 are formed on a top surface of such portion 106 (including the dielectric layer 104 and the circuit layer 105).

Then, a first encapsulant 230a is formed or disposed on the top surface of such portion 106 to cover the TFT module 12. Then, a plurality of conductive vias 16 extending through the first encapsulant 230a are formed. Then, an upper substrate 130 is formed or disposed on the first encapsulant 230a. Then, a plurality of light emitting devices 140 are disposed on the upper substrate 130, and electrically connected to the transistor 120 of the TFT module 12 through the conductive vias 16. Then, a protection layer 150 is formed or disposed on the upper substrate 130 to cover and protect the light emitting devices 140.

Referring to FIG. 32, at least one first electronic component (including, for example, a plurality of first electronic components 220, 221, 222) is/are disposed adjacent to and electrically connected to the top surface of the portion. Then, a second encapsulant 230b are formed to cover the at least one first electronic component (such as a plurality of first electronic components 220, 221, 222)). The second encapsulant 230b contacts the lateral side surface 1303 of the upper substrate 130 and the lateral side surface 1503 of the protection layer 150.

Referring to FIG. 33, a carrier 42 is attached to the protection layer 150, and the carrier 40 is removed. Then, at least one dielectric layer and at least one circuit layer are formed on the portion 106 to form a complete main substrate 10f. The interconnection vias 103f of the main substrate 10f tapers upward.

Then, the carrier 42 is removed. Then, a singulation process is conducted to obtain a plurality of semiconductor device packages if as shown in FIG. 10.

Figure 34:
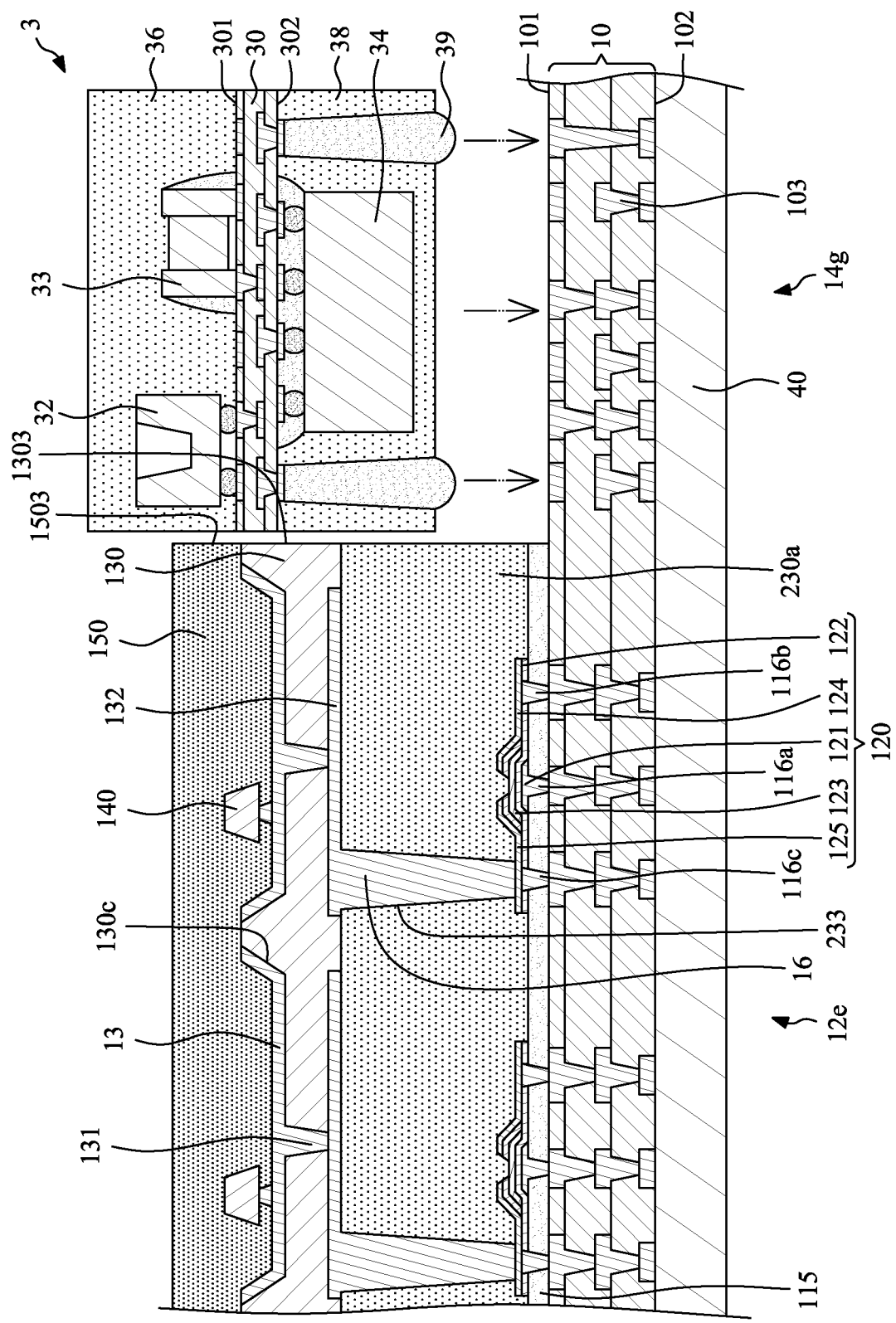
FIG. 34 illustrates one or more stages of an example of a method for manufacturing a semiconductor device package according to some embodiments of the present disclosure.

FIG. 34 illustrates a method for manufacturing a semiconductor device package according to some embodiments of the present disclosure. In some embodiments, the method is for manufacturing the semiconductor device package 1g shown in FIG. 11 and FIG. 12. The initial stages of the illustrated process are the same as, or similar to, the stage illustrated in FIG. 29. FIG. 34 depicts a stage subsequent to that depicted in FIG. 29.

Referring to FIG. 34, at least one package structure 3 is provided. The package structure 3 includes a package substrate 30, at least one first upper electronic component 32, 33, least one first lower electronic component 34, an upper package body 36, a lower package body 38 and at least one interconnection element 39. The package substrate 30 has an upper surface 301 and a lower surface 302 opposite to the upper surface 301. The first upper electronic components 32, 33 are electrically connected to the upper surface 301 of the package substrate 30. The first lower electronic component 34 is electrically connected to the lower surface 302 of the package substrate 30. The upper package body 36 may be a molding compound that covers the first upper electronic components 32, 33. The lower package body 38 may be a molding compound that coves the first lower electronic component 34. The interconnection element 39 (such as solder material or conductive bump) electrically connects the lower surface 302 of the package substrate 30, and may be embedded in the lower package body 38. The interconnection element 39 may be exposed from the lower package body 38.

Then, the package structure 3 is electrically connected to the component mounting region 14g on the first surface 101 of the main substrate 10 through the interconnection element 39. Then, the carrier 40 is removed. Then, a singulation process is conducted to obtain a plurality of semiconductor device packages 1g shown in FIG. 11 and FIG. 12.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within 50 µm of lying along a same plane, such as within 40 µm, within 30 µm, within 20 µm, within 10 µm, or within 1 µm of lying along the same plane. Two components can be deemed to be "substantially aligned" if, for example, the two components overlap or are within 200 µm, within 150 µm, within 100 µm, within 50 µm, within 40 µm, within 30 µm, within 20 µm, within 10 µm, or within 1 µm of overlapping. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package comprising:
   a first circuit;
   a driving circuit supported by the first circuit;
   a package structure supported by the first circuit, comprising:
      a first electronic component and a second electronic component partially overlapping the first electronic component along a first direction substantially perpendicular to a top surface of the first circuit;
      a package substrate and a second encapsulant, the first electronic component is connected to the package substrate, and the second encapsulant encapsulates the package substrate and the first electronic component; and
   a display device electrically connected to the package structure by the driving circuit, wherein the package structure is entirely disposed outside a projection of the display device along the first direction.

2. The semiconductor device package of claim 1, wherein the display device includes a second circuit overlapping the first electronic component or the second electronic component along a second direction substantially parallel with the top surface of the first circuit.

3. A semiconductor device package comprising:
   a display device;
   a driving circuit disposed under the display device;
   a first encapsulant encapsulating the driving circuit, wherein the driving circuit is spaced apart from the display device by the first encapsulant;
   a first electronic component disposed near to the driving circuit, wherein the first electronic component is below the display device, and the first encapsulant does not contact the first electronic component;
   a circuit supporting the driving circuit, the first electronic component and the display device; and
   a package structure supported by the circuit, wherein the package structure comprises a package substrate, the first electronic component and a second encapsulant, the first electronic component is connected to the package substrate, and the second encapsulant encapsulates the package substrate and the first electronic component.

4. The semiconductor device package of claim 3, wherein the display device includes a light emitting device and a protection layer covering the light emitting device, and the protection layer is free from overlapping the first electronic component in a direction substantially perpendicular to a top surface of the circuit.

5. The semiconductor device package of claim 1, wherein the package structure further includes a third electronic component overlaps the display device and the second electronic component along a second direction substantially parallel with the top surface of the first circuit.

6. The semiconductor device package of claim 1, wherein the package structure further includes a lower package body and an interconnection element, wherein the lower package body covers the first electronic component and a bottom surface of the package substrate, wherein the interconnection element extends through the lower package body and electrically connects the package substrate and the first circuit, wherein the interconnection element comprises a solder material disposed in the lower package body and tapering toward the package substrate, wherein the interconnection element includes a protrusion portion extending beyond the lower package body and tapering toward the first circuit.

7. The semiconductor device package of claim 1, wherein the package structure further includes a lower package body and an interconnection element, wherein the lower package body covers the first electronic component and a bottom surface of the package substrate, wherein the interconnection element extends through the lower package body and electrically connects the package substrate and the first circuit, wherein the interconnection element overlaps the driving circuit along a second direction substantially parallel with the top surface of the first circuit.

8. The semiconductor device package of claim 1, wherein a first gap is formed between the package structure and the display device, and a second gap is formed between the package structure and the first circuit, wherein the first gap is communicated with the second gap.

9. The semiconductor device package of claim 8, wherein a width of the first gap is less than a width of the second gap.

* * * * *